(12) United States Patent
Shioya et al.

(10) Patent No.: US 6,630,412 B2
(45) Date of Patent: Oct. 7, 2003

(54) SEMICONDUCTOR DEVICE AND METHOD OF MANUFACTURING THE SAME

(75) Inventors: Yoshimi Shioya, Tokyo (JP); Kouichi Ohira, Tokyo (JP); Kazuo Maeda, Tokyo (JP); Tomomi Suzuki, Tokyo (JP); Hiroshi Ikakura, Tokyo (JP); Youichi Yamamoto, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/897,069

(22) Filed: Jul. 3, 2001

(65) Prior Publication Data

US 2002/0013060 A1 Jan. 31, 2002

(30) Foreign Application Priority Data

Jul. 12, 2000 (JP) ........................... 2000-211460
Jan. 5, 2001 (JP) ........................... 2001-000873

(51) Int. Cl.$^7$ .............................................. H01L 21/31
(52) U.S. Cl. ..................................................... 438/780
(58) Field of Search ...................... 257/758; 438/699, 438/642, 780; 427/489

(56) References Cited

U.S. PATENT DOCUMENTS

| | | | | |
|---|---|---|---|---|
| 3,644,166 A | * | 2/1972 | Gause | 161/89 |
| 5,314,724 A | * | 5/1994 | Tsukune et al. | 427/489 |
| 5,506,177 A | * | 4/1996 | Kishimoto et al. | 438/624 |
| 5,605,867 A | | 2/1997 | Sato et al. | 437/235 |
| 5,656,337 A | | 8/1997 | Park et al. | 427/539 |
| 5,800,877 A | * | 9/1998 | Maeda et al. | 427/535 |
| 6,110,814 A | * | 8/2000 | Tokumasu et al. | 438/597 |
| 6,245,690 B1 | | 6/2001 | Yau et al. | 438/780 |
| 6,287,990 B1 | * | 9/2001 | Cheung et al. | 438/780 |
| 6,348,725 B2 | * | 2/2002 | Cheung et al. | 257/642 |

FOREIGN PATENT DOCUMENTS

| | | | |
|---|---|---|---|
| DE | 19654737 | 12/1996 | .......... H01L/21/31 |
| EP | 0771886 | 5/1997 | .......... C23C/16/36 |
| EP | 881678 | 2/1998 | |
| EP | 1128421 | 8/2001 | ........ H01L/21/316 |
| EP | 01115669 | 10/2002 | |
| JP | 11-288931 | 10/1999 | |
| WO | WO98/28465 | 7/1998 | .......... C23C/16/40 |
| WO | 98/50945 | 11/1998 | |
| WO | WO99/41423 A2 | 8/1999 | |
| WO | WO00/01012 | 1/2000 | .......... H01L/23/48 |
| WO | WO01/69642 | 9/2001 | ........... H01J/37/00 |

OTHER PUBLICATIONS

Electrochem. Soc. Fall Meeting Abstracts, Loboda et al, 1998, p. 344.
SEMICON Korea Technical Symposium 2000, Shi et al, p. 279.
The Japan Society of Applied Physics The 46th Spring Meeting Digests (1999), Endo et al, p. 897.
The Japan Society of Applied Physics The 60th Fall Meeting Digests (1999), p. 712, Matsuki et al.
The Japan Society of Applied Physics The 46th Spring Meeting Digests (1999), Uchida et al, p. 897.

* cited by examiner

Primary Examiner—David Nelms
Assistant Examiner—Thao P. Le
(74) Attorney, Agent, or Firm—Lorusso, Loud & Kelly

(57) ABSTRACT

In a semiconductor device manufacturing method for forming an interlayer insulating film having a low dielectric constant on a substrate 21 from a surface of which a copper wiring 23 is exposed, the interlayer insulating film consists of multi-layered insulating films 24, 25, 29 and the insulating film 24, that contacts to the copper wiring 23, out of the multi-layered insulating films 24, 25, 29 is formed by plasmanizing a film forming gas containing at least an alkyl compound having siloxane bonds and any one of nitrogen ($N_2$) and ammonia ($NH_3$) to react.

18 Claims, 22 Drawing Sheets

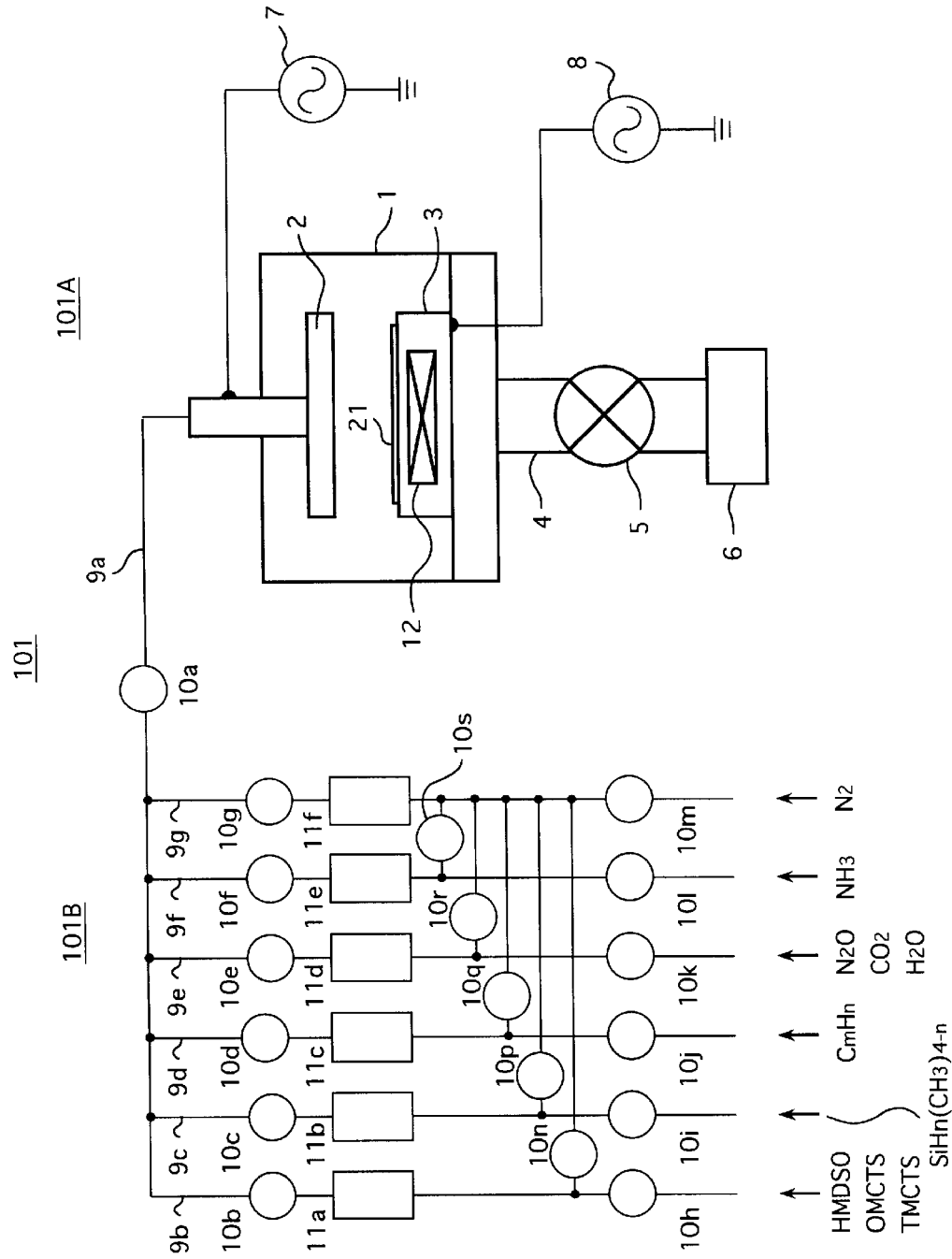

FIG. 2A
① Alkyl Compound Having the Siloxane Bonds
② $SiH_n(CH_3)_{4-n}$
③ $C_mH_n$
④ Oxygen-Containing Gas
⑤ $NH_3$ or $N_2$

FIG. 2B
① Alkyl Compound Having the Siloxane Bonds
② $SiH_n(CH_3)_{4-n}$
③ $C_mH_n$
④ Oxygen-Containing Gas
⑤ $NH_3$ or $N_2$

FIG. 2C
① Alkyl Compound Having the Siloxane Bonds
② $SiH_n(CH_3)_{4-n}$
③ $C_mH_n$
④ Oxygen-Containing Gas
⑤ $NH_3$ or $N_2$

FIG. 2D
① Alkyl Compound Having the Siloxane Bonds
② $SiH_n(CH_3)_{4-n}$
③ $C_mH_n$
④ Oxygen-Containing Gas
⑤ $NH_3$ or $N_2$

FIG. 3A

① Alkyl Compound Having the Siloxane Bonds
② SiHn(CH3)4-n
③ CmHn
④ Oxygen-Containing Gas
⑤ NH3 or N2

FIG. 3B

① Alkyl Compound Having the Siloxane Bonds
② SiHn(CH3)4-n
③ CmHn
④ Oxygen-Containing Gas
⑤ NH3 or N2

HMDSO Flow Rate : 50sccm
NH3 Flow Rate : 100sccm
Gas Pressure : 1 Torr
RF Power : 0W
LF Power : 150W
Substrate Temperature : 375°C HMDSO Flow Rate : 50sccm
Gas Pressure : 1 Torr
RF Power : 0W
LF Power : 150W
Substrate Temperature : 375°C HMDSO Flow Rate : 50sccm
Gas Pressure : 1 Torr
RF Power : 0W
LF Power : 150W
Substrate Temperature : 375°C HMDSO Flow Rate : 50sccm
Gas Pressure : 1 Torr
RF Power : 0W
LF Power : 150W
Substrate Temperature : 375°C ① N2O Flow Rate = 1200sccm
(Immediately After the Film Formation)

② N2O Flow Rate = 1200sccm
(After the Annealing)

③ N2O Flow Rate = 1600sccm
(Immediately After the Film Formation)

④ N2O Flow Rate = 1600sccm
(After the Annealing)

HMDSO Flow Rate : 50sccm
NH3 Flow Rate : 50sccm
N2O Flow Rate : 200sccm
Gas Pressure : 1 Torr
RF Power : 0W
LF Power : 150W
Substrate Temperature : 375°C HMDSO Flow Rate : 50sccm
N2O Flow Rate : 200sccm
Gas Pressure : 1 Torr
RF Power : 0W
LF Power : 150W
Substrate Temperature : 375°C

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, to a semiconductor device that has an interlayer insulating film for covering a copper wiring and having a low dielectric constant and a method of manufacturing the same.

2. Description of the Related Art

In recent years, with the progress of higher integration density in the semiconductor integrated circuit device, the increase of the data transfer rate is requested. Therefore, the insulating films having low dielectric constant and hence the small RC delay (referred to as a "low dielectric constant insulating film" hereinafter) is employed. Among these films are the SiOF film (relative dielectric constant of 3.5 to 3.8), the porous $SiO_2$ film (relative dielectric constant of 3.0 to 3.1), etc.

On the other hand, the wiring material is being changed from the conventional aluminum (Al) to the copper (Cu) of the low electric resistance.

In order to fabricate the semiconductor device having the conventional multi-layered copper wiring, the low dielectric constant insulating film is formed on the copper wiring as the interlayer insulating film. However, in general the copper in the copper wiring is ready to diffuse into the low dielectric constant insulating film, which increases the leakage current between upper and lower wirings. Therefore, in order to prevent the diffusion of the copper element into the low dielectric constant insulating film, the barrier insulating film formed of a silicon nitride film or the SiC-based barrier insulating film is simultaneously being developed.

Thus, in the semiconductor device having the copper wiring, the barrier insulating film formed of the silicon nitride film or the SiC-based barrier insulating film and the low dielectric constant insulating film are laminated in sequence on the copper wiring.

However, while the barrier insulating film formed of silicon nitride film is dense, its relative dielectric constant is high such as about 7. In contrast, the SiC-based barrier insulating film has the relatively low relative dielectric constant such as about 5, but it contains a large quantity of carbon and thus the increase of the leakage current cannot be sufficiently suppressed.

SUMMARY OF THE INVENTION

It is an object of the present invention to provide a semiconductor device capable of reducing the leakage current between the copper wirings that sandwich the interlayer insulating film of multi-layered structure, together with maintaining the low dielectric constant of the interlayer insulating film, and a method of manufacturing the same.

In the present invention, an insulating film for covering a copper wiring is formed by plasmanizing and reacting a film forming gas containing at least an alkyl compound having siloxane bonds and any one of nitrogen ($N_2$) and ammonia ($NH_3$).

The insulating film may also be formed by plasmanizing and reacting a film forming gas containing at least methylsilane (any one of monomethylsilane ($SiH_3(CH_3)$), dimethylsilane ($SiH_2(CH_3)_2$) trimethylsilane ($SiH(CH_3)_3$), and tetramethylsilane ($Si(CH_3)_4$)), an oxygen-containing gas (any one of $N_2O$, $H_2O$ and $CO_2$), and any one of nitrogen ($N_2$) and ammonia ($NH_3$).

Since the film forming gas contains any one of nitrogen ($N_2$) and ammonia ($NH_3$), the formed film contains nitrogen in any method of the present invention. Therefore, the insulating film that has the density close to the silicon nitride film and has the lower dielectric constant than the silicon nitride film can be formed.

Particularly, when a parallel-plate plasma film forming equipment is employed, connecting a low frequency power and applying the low frequency to an electrode, that holds a substrate, can make the low dielectric constant insulating film denser.

Furthermore, when the interlayer insulating film has multi-layered structure, it is preferable to form a barrier insulating film, which constitutes one of the film of the multi-layered structure and is in contact with a copper wiring, in accordance with the above method since this prevents copper in the wiring from diffusing into the interlayer insulating film and hence a leakage current between the copper wirings can be reduced. In this case, the dielectric constant of the overall interlayer insulating film can be lowered using an insulating film, which has lower dielectric constant than that of the barrier insulating film, for a film that constitutes other film of the multi-layered interlayer insulating film.

As described above, according to the present invention, the interlayer insulating film having low dielectric constant together with reducing the leakage current between the copper wirings that sandwiches the same can be formed.

BRIEF DESCRIPTION OF THE DRAWINGS

FIG. 1 is a side view showing a configuration of a plasma film forming equipment employed in a semiconductor device manufacturing method according to a first embodiment of the present invention;

FIGS. 2A to 2D are a timing chart showing introducing timing of a siloxane-based film forming gas into a chamber of the plasma film forming equipment employed in the semiconductor device manufacturing method according to the first embodiment of the present invention respectively;

FIGS. 3A and 3B are a timing chart showing introducing timing of a methylsilane-based film forming gas into a chamber of the plasma film forming equipment employed in the semiconductor device manufacturing method according to the first embodiment of the present invention respectively;

DESCRIPTION OF THE PREFERRED EMBODIMENTS

Figure 4:
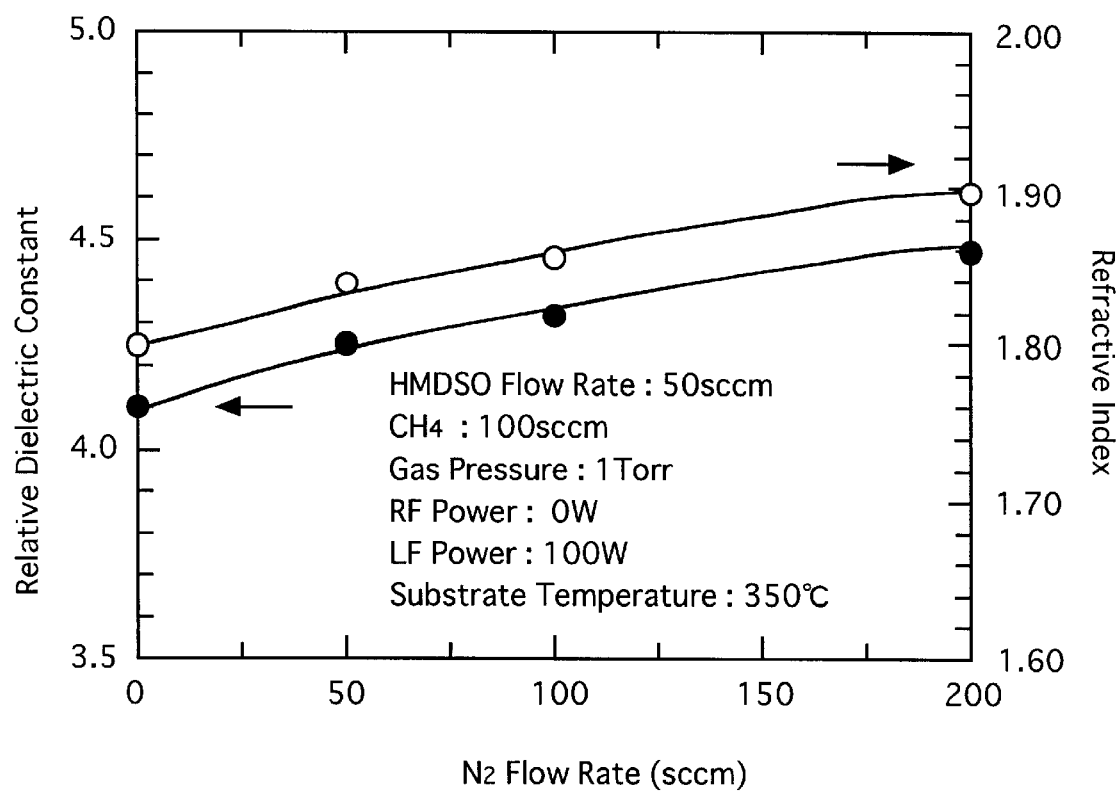
FIG. 4 is a graph showing characteristics of a relative dielectric constant and a refractive index of a low dielectric constant insulating film according to a second embodiment of the present invention.

Embodiments of the present invention will be explained in detail with reference to the accompanying drawings hereinafter.

First Embodiment

FIG. 1 is a side view showing a configuration of the parallel-plate plasma film forming equipment 101 employed in a semiconductor device manufacturing method according to a first embodiment of the present invention.

This plasma film forming equipment 101 comprises a film forming portion 101A in which a barrier insulating film is formed on a substrate 21 by using a plasmanized gas, and a film forming gas supplying portion 101B having a plurality of gas supply sources, each of the sources serving as sources for film forming gas.

As shown in FIG. 1, the film forming portion 101A includes a chamber 1 whose inner pressure can be lowered, and the chamber 1 is connected to an exhausting apparatus 6 via an exhaust line 4. An opening/closing valve 5 for controlling the communication/uncommunication between the chamber 1 and the exhausting apparatus 6 is provided in the middle of the exhaust line 4. A pressure measuring means such as a vacuum gauge (not shown) for monitoring the pressure in the chamber 1 is provided to the chamber 1.

A pair of upper electrode (first electrode) 2 and lower electrode (second electrode) 3, that oppose to each other, are provided in the chamber 1. A high frequency power supply (RF power supply) 7 for supplying a high frequency power whose frequency is 13.56 MHz is eclectically connected to the upper electrode 2, while a low frequency power supply (LF power supply) 8 for supplying a low frequency power whose frequency is 380 kHz is electrically connected to the lower electrode 3. In this invention, "AC power" should be understood to include the both high frequency power ($P_{RF}$) and low frequency power ($P_{LF}$).

The film forming gas is plasmanized by supplying the power to the upper electrode 2 and the lower electrode 3 from these power supplies 7, 8. The upper electrode 2, the lower electrode 3, and the power supplies 7, 8 constitute a plasma generating means for plasmanizing the film forming gas. It is preferable that an distance between the upper and lower electrodes 2, 3 is set to more than a thickness of the substrate but less than 30 mm in order to form the denser insulating film.

It should be noted that the frequency of the low frequency power is not limited to 380 kHz. For example, low frequency power of 100 kHz to 1 MHz may be used and applied to the lower electrode 7 in the alternative. Similarly, frequency of the high frequency power is not limited to 13.56 MHz. For example, high frequency of more than 1 MHz may be used and applied to the upper electrode 2 in the alternative.

The upper electrode 2 is also used as a gas distributing means for distributing a film forming gas. A plurality of through holes (not shown) are formed in the upper electrode 2, and opening portions of the through holes positioned on a surface opposing to the lower electrode 3 serve as introducing ports of the film forming gas. The introducing ports are connected to the film forming gas supplying portion 101B via a line 9a. Also, a heater (not shown) may be provided to the upper electrode 2 in some cases. This heater serves to prevent the adhesion of particles formed of the reaction products of the film forming gas, etc. onto the upper electrode 2 by heating the upper electrode 2 up to the temperature of about 100° C. during the film formation.

The lower electrode 3 is also used as a loading table of the substrate 21. A heater 12 is provided for the lower electrode 3 to heat the substrate 21 that is loaded on the electrode 3.

In the film forming gas supplying portion 101B, there are provided a supply source for alkyl compound such as hexamethyldisiloxane (HMDSO: $(CH_3)_3Si$—O—$Si(CH_3)_3$), etc. having siloxane bonds, a supply source for methylsilane expressed by the general formula $SiH_n(CH_3)_{4-n}$ (n=0 to 3), a supply source for a gas having hydrocarbon ($C_mH_n$), a supply source for an oxygen containing gas such as carbon monooxide ($N_2O$), water ($H_2O$), or carbon dioxide ($CO_2$), a supply source for ammonia ($NH_3$), and a supply source for nitrogen ($N_2$).

These gases are supplied appropriately to the chamber 1 in the film forming portion 101A via branch lines 9b to 9g and the line 9a to which theses lines are connected. Flow rate adjusting means 11a to 11f and opening/closing means 10b to 10m for controlling the communication/uncommunication of the branch lines 9b to 9g are provided in the middle of the branch lines 9b to 9g, and also an opening/closing means 10a for opening/closing the line 9a is provided in the middle of the line 9a. Also, in order to purge the residual gas in the branch lines 9b to 9f by flowing the $N_2$ gas therethrough, opening/closing means 10n, 10p to 10s for controlling the communication/uncommunication between the branch line 9g connected to the $N_2$ gas supply source and other branch lines 9b to 9f are provided. The $N_2$ gas is also employed to purge the residual gas in the line 9a and the chamber 1 in addition to the branch lines 9b to 9f. The $N_2$ gas is also used as the film forming gas.

According to the film forming equipment 101 described above, there are provided the supply source for the alkyl compound such as hexamethyldisiloxane (HMDSO), etc. having the siloxane bonds, the supply source for the methylsilane expressed by the general formula $SiH_n(CH_3)_{4-n}$ (n=0 to 3), the supply source for the gas having the hydrocarbon ($C_mH_n$), the supply source for the oxygen containing gas such as carbon monooxide ($N_2O$), water ($H_2O$), or carbon dioxide ($CO_2$), the supply source for the ammonia ($NH_3$), and the supply source for the nitrogen ($N_2$). In addition, there are provided plasma generating means 2, 3, 7, 8 for plasmanizing the film forming gas.

If this film forming equipment 101 is employed, the film is formed by the plasma CVD method, and this film contains nitrogen and either or both of Si—C and $CH_3$. Therefore, the dense barrier insulating film that has the low dielectric constant and can suppress the copper diffusion can be formed.

It should be noted that the plasma generating means is not limited to the first and second electrodes 2, 3 of the parallel-plate type. For example, plasma generating means using the ECR (Electron Cyclotron Resonance) method, or using helicon plasma by irradiating the high frequency power from the antenna, etc. may be used in the alternative.

Among these methods, however, parallel-plate type is particularly preferable since the film formed in accordance with this method is, not only low dielectric constant due to Si—C or $CH_3$ contained therein, but also dense.

Next, the gas containing the alkyl compound having the siloxane bonds, the methylsilane, and the hydrocarbon, each of which constitutes the film forming gas for the barrier insulating film of the present invention, will be explained hereunder.

Components described in the following may be employed as typical examples.

(i) Alkyl compound having the siloxane bonds Hexamethyldisiloxane (HMDSO: $(CH_3)_3Si—O—Si(CH_3)_3$)

Octamethylcyclotetrasiloxane (OMCTS:

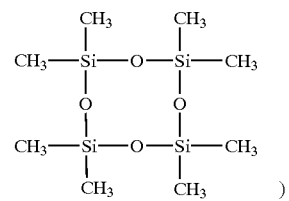
)

Tetrametylcyclotetrasiloxane (TMCTS:

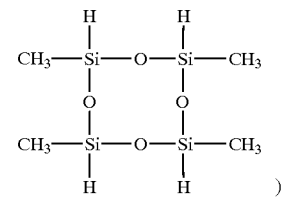
)

(ii) Methylsilane ($SiH_n(CH_3)_{4-n}$:n=0 to 3)
Monomethylsilane ($SiH_3(CH_3)$)
Dimethylsilane ($SiH_2(CH_3)_2$)
Trimethylsilane ($SiH(CH_3)_3$)
Tetramethylsilane ($Si(CH_3)_4$)
(iii) A gas having hydrocarbon ($C_mH_n$)
Methane ($CH_4$)
Acetylene ($C_2H_2$)
Ethylene ($C_2H_4$)
Ethane ($C_2H_6$)

Next, particularly preferable gas combinations will be explained with reference to FIGS. 2A to 2D and FIGS. 3A and 3B hereunder.

FIGS. 2A to 2D are a timing chart showing introducing timings of respective gases constituting the film forming gas into the chamber 1. In these figures, the film forming gas contains at least the alkyl compound having the siloxane bonds and any one of $NH_3$ or $N_2$.

Among these figures, FIG. 2A is a timing chart for a case where the film forming gas is composed only of the alkyl compound having the siloxane bonds and any one of $NH_3$ and $N_2$.

FIG. 2B is a timing chart for a case where the film forming gas is composed only of the alkyl compound having the siloxane bonds, hydrocarbon, and any one of $NH_3$ or $N_2$. In this case, the hydrocarbon may be supplied prior to the flow of other gases into the chamber 1. This may increase a possibility of obtaining an improved barrier property by a C—H layer, which is formed on a film forming surface due to the contact with the hydrocarbon.

FIG. 2C is a timing chart for a case where the film forming gas is composed only of the alkyl compound having the siloxane bonds, an oxygen-containing gas, and any one of $NH_3$ or $N_2$.

FIG. 2D is a timing chart for a case where the film forming gas is composed of the alkyl compound having the siloxane bonds, hydrocarbon, an oxygen-containing gas, and any one of $NH_3$ or $N_2$. For the same reason as mentioned above, the hydrocarbon may be supplied prior to the flow of other gases into the chamber 1.

FIGS. 3A and 3B are timing charts for cases where the film forming gas contains at least methylsilane ($SiH_n(CH_3)_{4-n}$), the oxygen-containing gas such as $N_2O$, etc., and any one of $NH_3$ or $N_2$.

Among these figures, FIG. 3A is a timing chart for a case where the film forming gas is composed of the methylsilane, the oxygen-containing gas such as $N_2O$, etc., and any one of $NH_3$ or $N_2$. On the other hand, FIG. 3B is a timing chart for a case where the film forming gas is composed of methylsilane, the hydrocarbon, the oxygen-containing gas such as $N_2O$, etc., and any one of $NH_3$ or $N_2$.

Depending on the gas type constituting the film forming gas, suitable timing chart may be selected form the above figures, and in accordance with these timing chart, a plasma CVD insulating film of the preset invention can be formed.

Second to Fourth Embodiments

Next, investigation results of characteristics of the silicon-containing insulating film that is formed by the above semiconductor device manufacturing equipment will be explained hereunder.

(a) Characteristics of the silicon-containing insulating film formed by using the film forming gas containing $N_2$, which is a second embodiment of the present invention.

Figure 5:
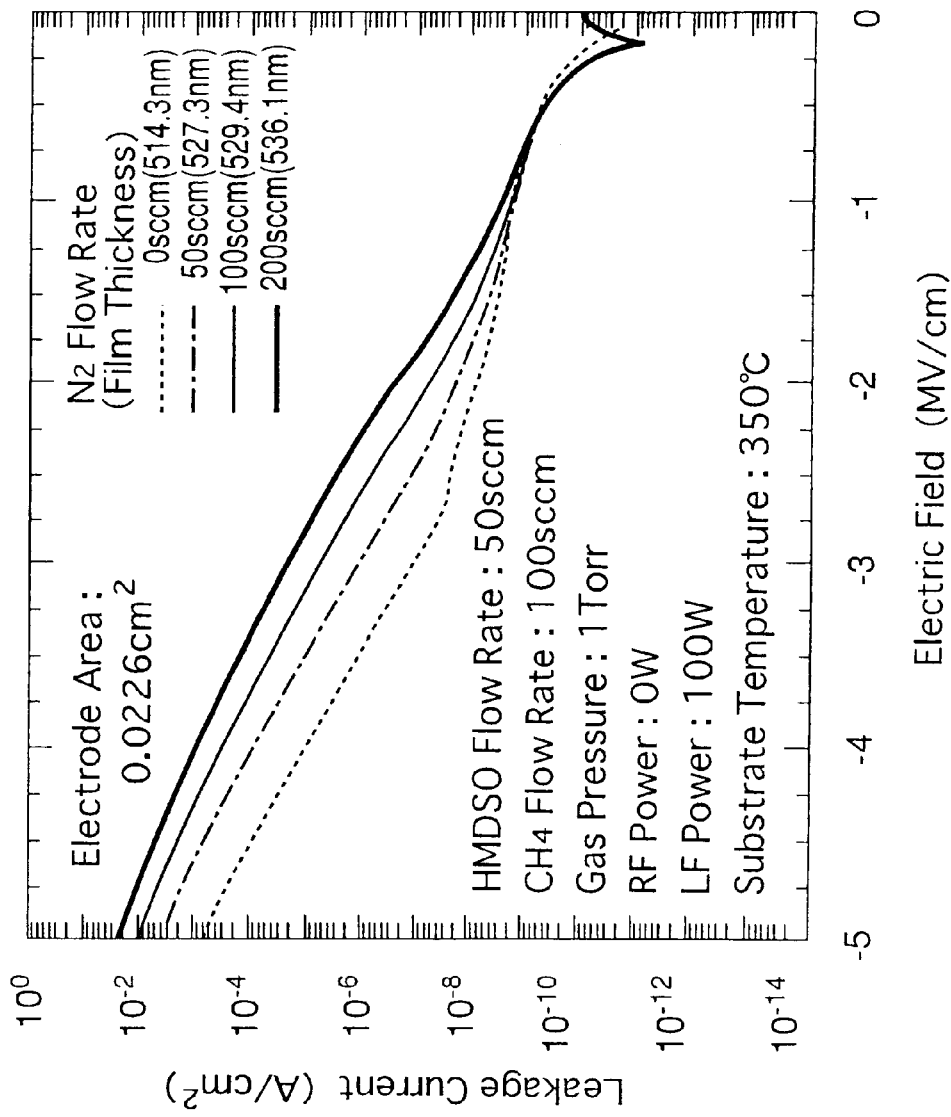
FIG. 5 is a graph showing a characteristic of a leakage current of the low dielectric constant insulating film according to the second embodiment of the present invention.

FIG. 4 is a graph showing behaviors of a relative dielectric constant and a refractive index of the silicon-containing insulating film 33 in response to the change in the $N_2$ flow rate. FIG. 5 is a graph showing investigation results of the leakage current flowing between a copper film 34 and a substrate 32 between which the silicon-containing insulating film 33 is sandwiched.

Figure 19:
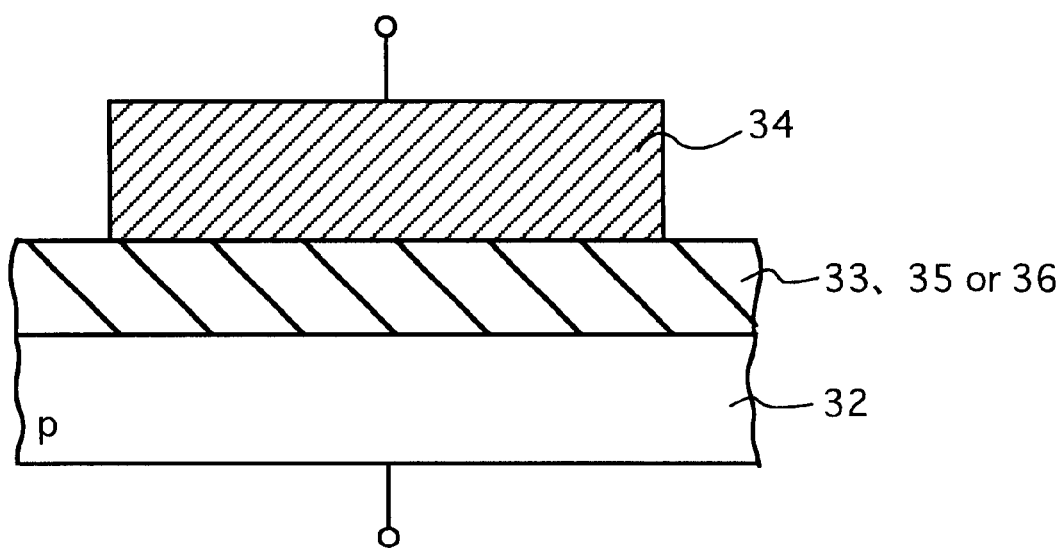
FIG. 19 is a sectional view showing a structure of a sample employed in the investigation for the characteristic of a barrier insulating film according to the second to fourth embodiments of the present invention.

FIG. 19 is a sectional view showing a structure of a sample employed in the above investigation, and the sample was formed as follows. That is, as shown in FIG. 19, the silicon-containing insulating film 33 was formed on the p-type silicon substrate 32 by the plasma CVD method using HMDSO, $CH_4$, and $N_2$ as the film forming gas. Film forming conditions for the silicon-containing insulating film 33 are given by (Condition A) described in the following.

Condition A (i) Film forming gas conditions
HMDSO flow rate: 50 sccm
$CH_4$ flow rate: 100 sccm
$N_2$ flow rate: 0, 50, 100, 200 sccm
gas pressure: 1 Torr
substrate heating temperature: 350° C.
(ii) Plasmanizing conditions
high frequency power (13.56 MHz) $P_{RF}$: 0 W
low frequency power (380 kHz) $P_{LF}$: 100 W
distance between the upper electrode and the lower electrode: more than 20 mm, preferably more than 25 mm A film thickness of the silicon-containing insulating film 33 was 514.3 nm, 527.3 nm, 529.4 nm, and 536.1 nm respectively for the $N_2$ flow rate of 0, 50, 100, and 200 sccm.

In addition, a mercury probe 34 having an electrode area of 0.0226 cm was brought into contact with a surface of the silicon-containing insulating film 33.

In case where the relative dielectric constant was measured, the C—V measuring method in which a high frequency signal of 1 MHz was superposed onto the DC bias was employed. In case where the refractive index was measured, the He—Ne laser having a wavelength of 633.8 nm was employed in the ellipsometer. Also, in case where the leakage current was measured, the silicon substrate 32 was grounded together with applying a negative voltage to the mercury probe 34.

Measured results of the relative dielectric constant and the refractive index of the silicon-containing insulating film 33 formed in accordance with the (condition A) are shown in FIG. 4. An ordinate on the left side of FIG. 4 denotes the relative dielectric constant represented in a linear scale, while an ordinate on the right side thereof denotes the refractive index represented in a linear scale. An abscissa denotes the $N_2$ flow rate (sccm) represented in a linear scale. As shown in FIG. 4, the relative dielectric constant is about 4.1 and about 4.45 respectively when the $N_2$ flow rate is 0 sccm and 200 sccm, and is increased as the $N_2$ flow rate is increased. Also, the refractive index exhibits the similar tendency, and is about 1.80 and about 1.90 respectively when the $N_2$ flow rate is 0 sccm and 200 sccm.

Also, measured results of the leakage current are shown in FIG. 5. An ordinate of FIG. 5 denotes the leakage current ($A/cm^2$) represented in a logarithmic scale, while an abscissa thereof denotes the electric field (MV/cm), which is applied to the silicon-containing insulating film 33, represented in a linear scale. Carves in the graph are parameterized by the $N_2$ flow rate. Also, the numeral in the parenthesis positioned after the flow rate (sccm) denotes the film thickness (nm). In addition, the negative sign on the abscissa indicates that the negative voltage is applied to the mercury probe 34.

As shown in FIG. 5, as the $N_2$ flow rate decreases, the leakage current correspondingly decreases. It is preferable that the leakage current is below $10^{-9}$ $A/cm^2$ at 1 MV/cm in practical use.

(b) Characteristics of the silicon-containing insulating film formed by using the film forming gas containing $NH_3$, which is a third embodiment of the present invention.

Figure 6:
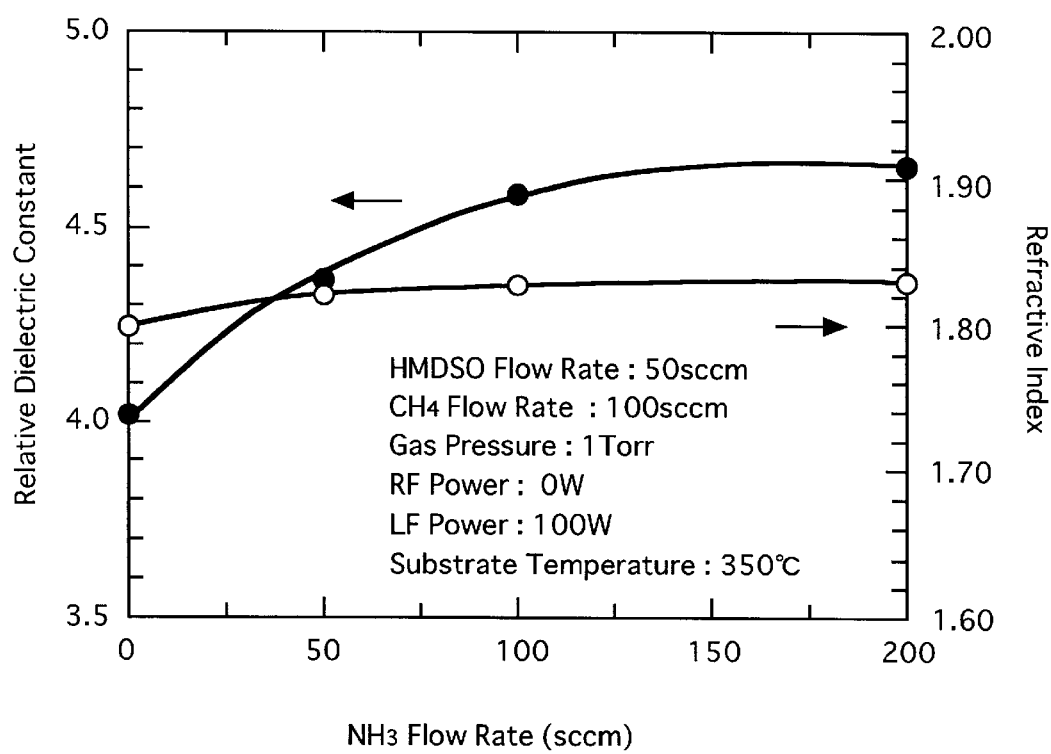
FIG. 6 is a graph showing characteristics of a relative dielectric constant and a refractive index of a low dielectric constant insulating film according to a third embodiment of the present invention.
Figure 7:
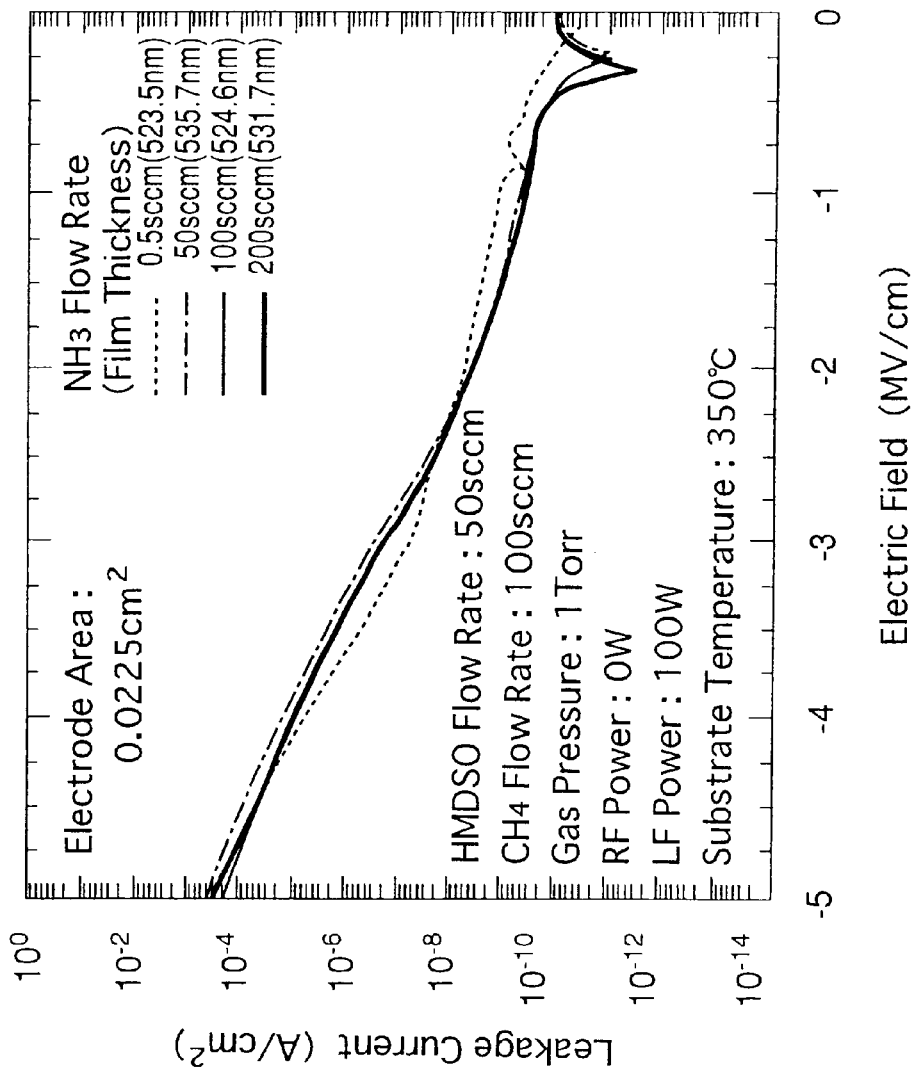
FIG. 7 is a graph showing a characteristic of a leakage current of the low dielectric constant insulating film according to the third embodiment of the present invention.

FIG. 6 is a graph showing behaviors of the relative dielectric constant and the refractive index of the silicon-containing insulating film 35 in response to the change in the $NH_3$ flow rate. FIG. 7 is a graph showing an investigation result of the leakage current flowing between the copper film 34 and the substrate 32 between which the silicon-containing insulating film 35 is sandwiched.

FIG. 19 is the sectional view showing the structure of the sample employed in the above examination, and the sample was formed as follows. That is, as shown in FIG. 19, the silicon-containing insulating film 35 was formed on the p-type silicon substrate 32 by the plasma CVD method using HMDSO, $CH_4$, and $NH_3$ as the film forming gas. Film forming conditions for the silicon-containing insulating film 35 are given by (Condition B) described in the following.

Condition B (i) Film forming gas conditions
HMDSO flow rate: 50 sccm
$CH_4$ flow rate: 100 sccm
$NH_3$ flow rate: 0, 50, 100, 200 sccm
gas pressure: 1 Torr
substrate heating temperature: 350° C.
(ii) Plasmanizing conditions
high frequency power (13.56 MHz) $P_{RF}$: 0 W
low frequency power (380 kHz) $P_{LF}$: 100 W
distance between the upper electrode and the lower electrode: more than 20 mm, preferably more than 25 mm A film thickness of the silicon-containing insulating film 35 was 523.5 nm, 535.7 nm, 524.6 nm, and 531.7 nm respectively for the $NH_3$ flow rate of 0, 50, 100, and 200 sccm.

In addition, the mercury probe 34 having an electrode area of 0.0225 $cm^2$ was brought into contact with a surface of the silicon-containing insulating film 35.

In case where the relative dielectric constant was measured, the C—V measuring method in which a high frequency signal of 1 MHz was superposed onto the DC bias was employed. In case where the refractive index was measured, the He—Ne laser of 633.8 nm was employed in the ellipsometer. Also, in case where the leakage current was measured, the silicon substrate 32 was grounded together with applying a negative voltage to the mercury probe 34.

Measured results of the relative dielectric constant and the refractive index of the silicon-containing insulating film 35 formed in accordance with (Condition B) are shown in FIG. 6. An ordinate on the left side of FIG. 6 denotes the relative dielectric constant represented in a linear scale, while an ordinate on the right side thereof denotes the refractive index represented in a linear scale. An abscissa denotes the $NH_3$ flow rate (sccm) represented in a linear scale. As shown in FIG. 6, the relative dielectric constant is about 4.02 and about 4.6 respectively when the $NH_3$ flow rate is 0 sccm and 100 sccm, and is increased as the $NH_3$ flow rate is increased. Also, the refractive index exhibits the similar tendency, and is about 1.8 and about 1.83 respectively when the $NH_3$ flow rate is 0 sccm and 200 sccm.

Also, measured results of the leakage current are shown in FIG. 7. An ordinate of FIG. 7 denotes the leakage current ($A/cm^2$) represented in a logarithmic scale, while an abscissa thereof denotes the electric field (MV/cm), which is applied to the silicon-containing insulating film 35, represented in a linear scale. Carves in the graph are parameterized by the $NH_3$ flow rate. Also, the numeral in the parenthesis positioned after the flow rate (sccm) denotes the film thickness (nm). In addition, the negative sign on the abscissa indicates that the negative voltage is applied to the mercury probe 34.

As shown in FIG. 7, the leakage current is seldom affected by the $NH_3$ flow rate. It is preferable that the leakage current is below $10^{-9}$ $A/cm^2$ at 1 MV/cm in practical use.

Though HMDSO is employed in the above, the alkyl compound having the siloxane bonds is not limited to HMDSO. For example, another alkyl compound having the siloxane bonds, such as octamethylcyclotetrasiloxane (OMCTS) or tetrametylcyclotetrasiloxane (TMCTS), both are already mentioned above, may be employed in the alternative.

Also, hydrocarbon gas is not limited to methane ($CH_4$). For example, any one of acetylene ($C_2H_2$), ethylene ($C_2H_4$), or ethane ($C_2H_6$) may be employed in the alternative.

Though it is preferable to employ the hydrocarbon gas, the silicon-containing insulating film 35 of low leakage current and of low dielectric constant can be formed if the hydrocarbon gas is dispensed with.

Film forming conditions for the silicon-containing insulating film 35 when the hydrocarbon gas is not used are given by (Condition C) described in the following.

Condition C (i) Film forming gas conditions

HMDSO flow rate: 50 sccm $NH_3$ flow rate: 0 to 800 sccm gas pressure: 1 Torr substrate heating temperature: 375° C.

Figure 8:
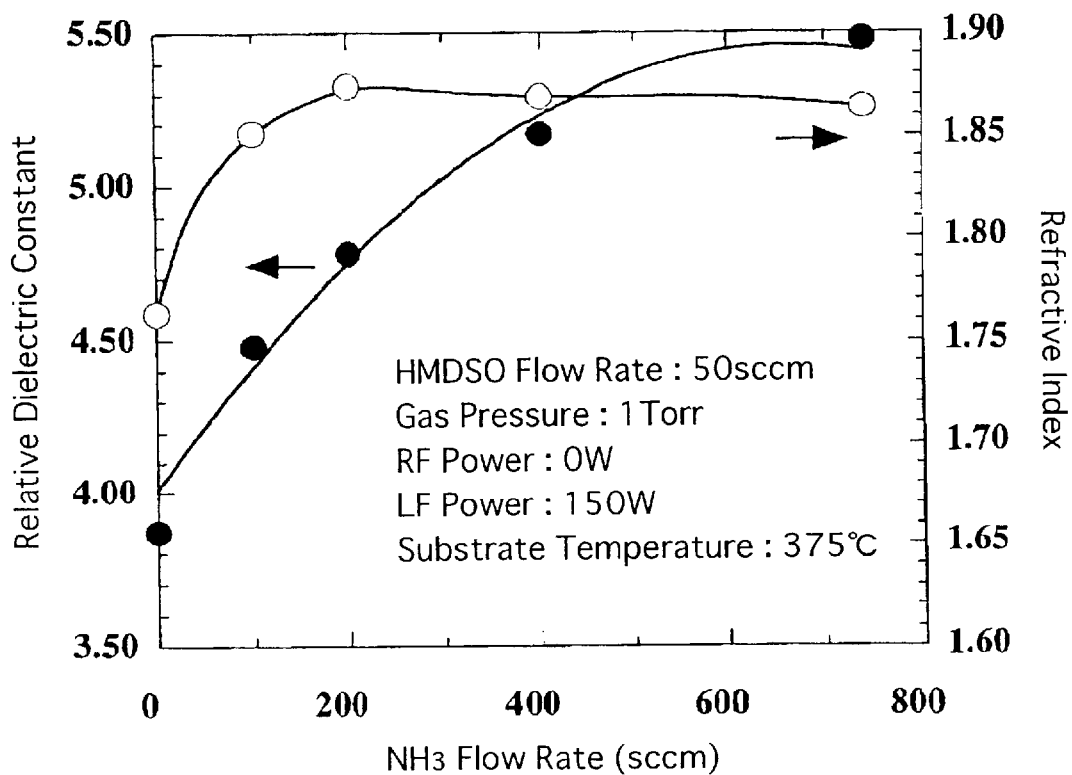
FIG. 8 is a graph showing the characteristics of the relative dielectric constant and the refractive index of the low dielectric constant insulating film when a hydrocarbon gas is not employed in the third embodiment of the present invention.

(ii) Plasmanizing conditions high frequency power (13.56 MHz) $P_{RF}$: 0 W low frequency power (380 kHz) $P_{LF}$: 150 W distance between the upper electrode and the lower electrode: 12.5 mm FIG. 8 is a graph showing the characteristics of the relative dielectric constant and the refractive index of the silicon-containing insulating film 35 when the film is formed in accordance with (Condition C). The method of measuring the relative dielectric constant and the refractive index and meanings of the ordinate and the abscissa of FIG. 8 are similar to those explained in FIG. 6.

As shown in FIG. 8, the relative dielectric constant lies in the range of 3.9 to 5.5. These values are lower than the relative dielectric constant (about 7) of the silicon nitride film in the prior art.

Figure 9:
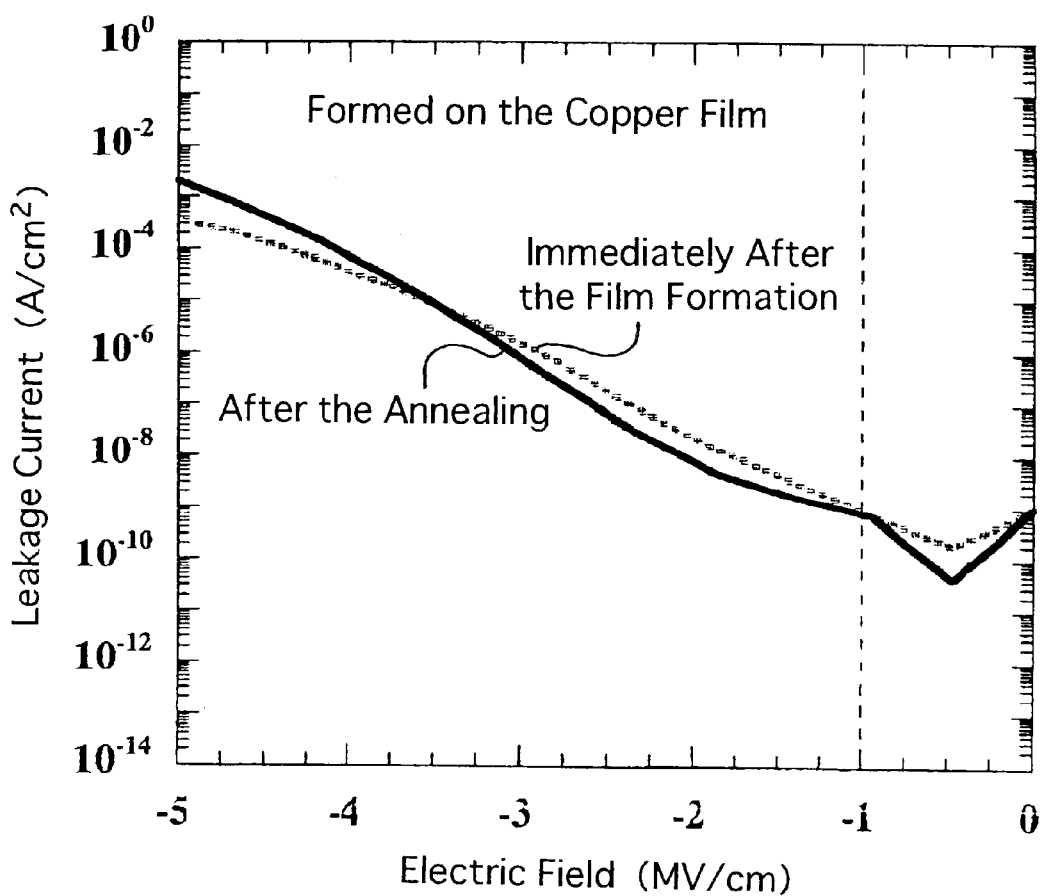
FIG. 9 is a graph showing the characteristic of the leakage current of the low dielectric constant insulating film obtained immediately after the film formation and after the annealing when the hydrocarbon gas is not employed in the third embodiment of the present invention.

FIG. 9 is a graph showing measured results of the leakage current of the silicon-containing insulating film 35 after it is annealed in vacuum at 450° C. for 4 hours. In this measurement, the silicon-containing insulating film 35 was formed on the copper film (not shown) in place of the p-type silicon substrate 32 (see FIG. 19). Then, in forming the silicon-containing insulating film 35, the $NH_3$ flow rate was set to 100 sccm and remaining film forming conditions were set identical to (Condition C). For the sake of comparison, the leakage current of the silicon-containing insulating film 35, which was measured immediately after forming the film, is also depicted in FIG. 9. The method of measuring the leakage current and meanings of the ordinate and the abscissa of FIG. 9 are similar to those explained in FIG. 7.

As shown in FIG. 9, the leakage current does not remarkably increase even after the annealing.

Figure 10:
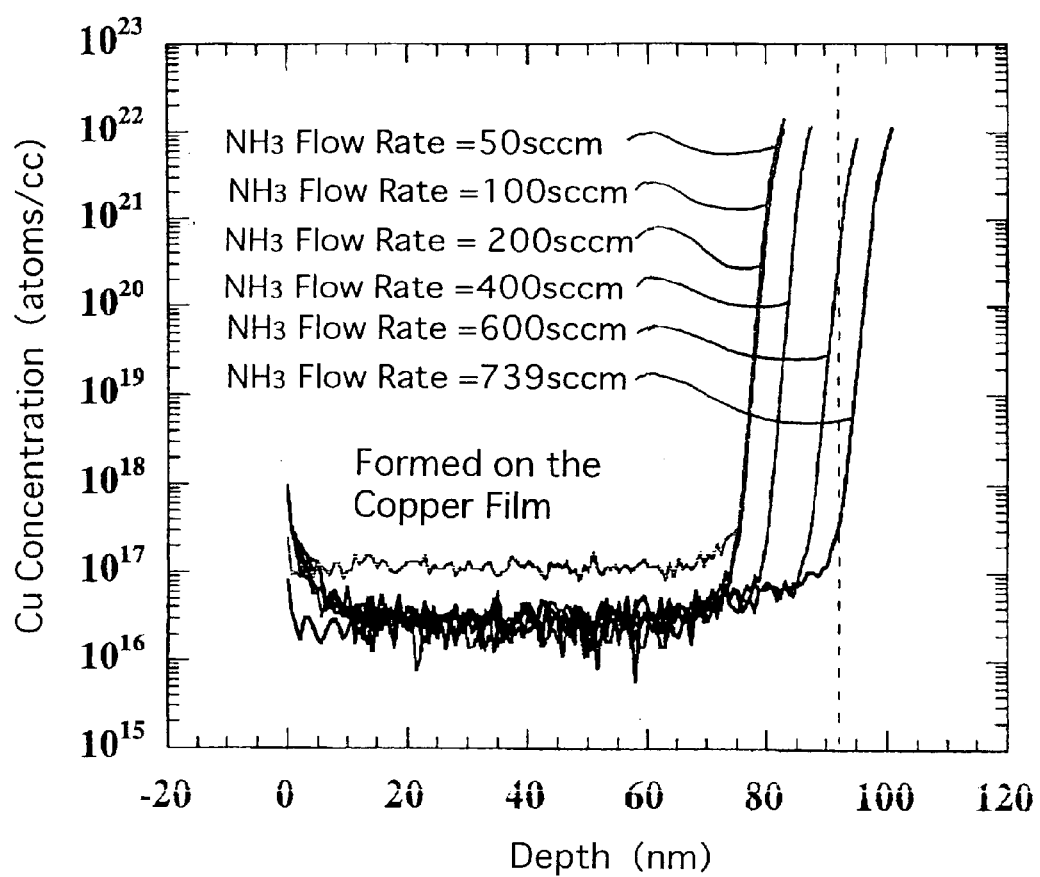
FIG. 10 is a graph showing investigation results of the copper diffusion in the low dielectric constant insulating film after the annealing when the hydrocarbon gas is not employed in the third embodiment of the present invention.

FIG. 10 is a graph showing investigation results of the copper diffusion in the silicon-containing insulating film 35, which was formed in accordance with (Condition C) and was annealed in vacuum at 450° C. for 4 hours. In this investigation, the silicon-containing insulating film 35 was formed on the copper film (not shown). And various silicon-containing insulating films 35 were investigated at various level of the $NH_3$ flow rate within the (Condition C).

The diffusion of the copper was examined by using SIMS (Secondary Ion Mass Spectroscopy).

An abscissa of FIG. 10 denotes a depth from a surface of the silicon-containing insulating film 35, which is represented in a linear scale. In contrast, an ordinate thereof denotes a copper (Cu) concentration (atoms/cc) in the film, which is represented in a logarithmic scale.

As shown in FIG. 10, the copper is seldom diffused from the underlying copper film (not shown) into the silicon-containing insulating film 35. Though the copper concentration increases at the depth of about 80 nm, this is because this depth is positioned very close to the underlying copper film (not shown), and there is no problem in practical use.

(c) Characteristics of the silicon-containing insulating film formed by using the film forming gas containing $N_2O$, which is a fourth embodiment of the present invention.

In the above second and third embodiments, $N_2$ or $NH_3$ was added into the film forming gas. However, if $N_2O$ is added in place of $N_2$ and $NH_3$, the silicon-containing insulating film 35 of suppressed leakage current and of low dielectric constant can be formed.

FIG. 19 is the sectional view showing the structure of the sample employed in the following investigation, and the sample is formed as follows. That is, as shown in FIG. 19, a silicon-containing insulating film 36 was formed on the p-type silicon substrate 32 by the plasma CVD method using HMDSO, and $N_2O$ as the film forming gas. Film forming conditions for the silicon-containing insulating film 36 are given by (Condition D) described in the following.

Condition D (i) Film forming gas conditions

HMDSO flow rate: 50 sccm $N_2O$ flow rate: 0 to 800 sccm gas pressure: 1 Torr substrate heating temperature: 375° C.

Figure 11:
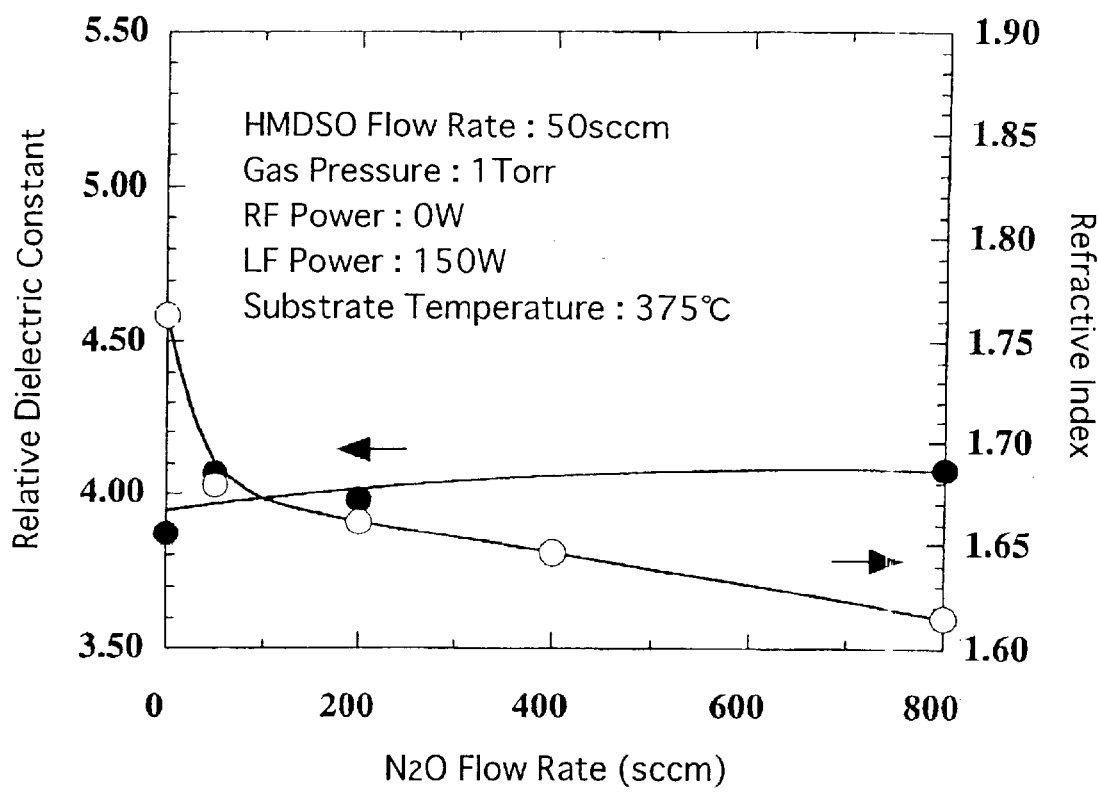
FIG. 11 is a graph showing characteristics of a relative dielectric constant and a refractive index of a low dielectric constant insulating film according to a fourth embodiment of the present invention.

(ii) Plasmanizing conditions high frequency power (13.56 MHz) $P_{RF}$: 0 W low frequency power (380 kHz) $P_{LF}$: 150 W distance between the upper electrode and the lower electrode: 12.5 mm FIG. 11 is a graph showing characteristics of the relative dielectric constant and the refractive index of the silicon-containing insulating film 36 when the film was formed in accordance with this (Condition D). The method of measuring the relative dielectric constant and the refractive index and meanings of the ordinate and the abscissa of FIG. 11 are similar to those explained in FIG. 6.

As shown in FIG. 11, the relative dielectric constant lies in the range of about 3.9 to 4.1. These values are lower than the relative dielectric constant (about 7) of the silicon nitride film in the prior art.

Figure 12A:
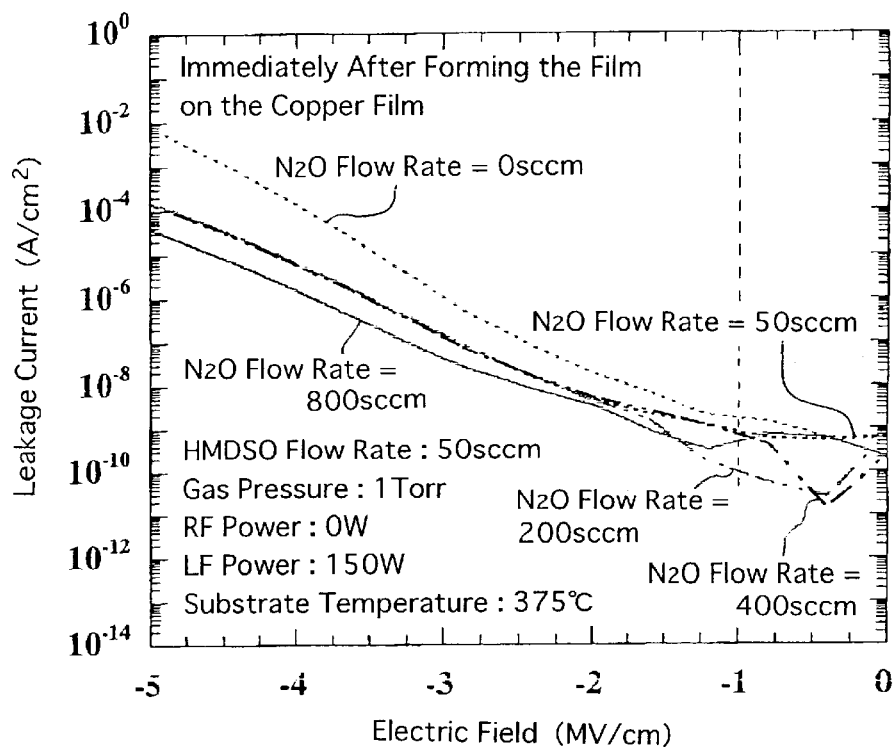
FIG. 12A is a graph showing characteristics of a leakage current of the low dielectric constant insulating film according to the fourth embodiment of the present invention immediately after the film formation.
Figure 12B:
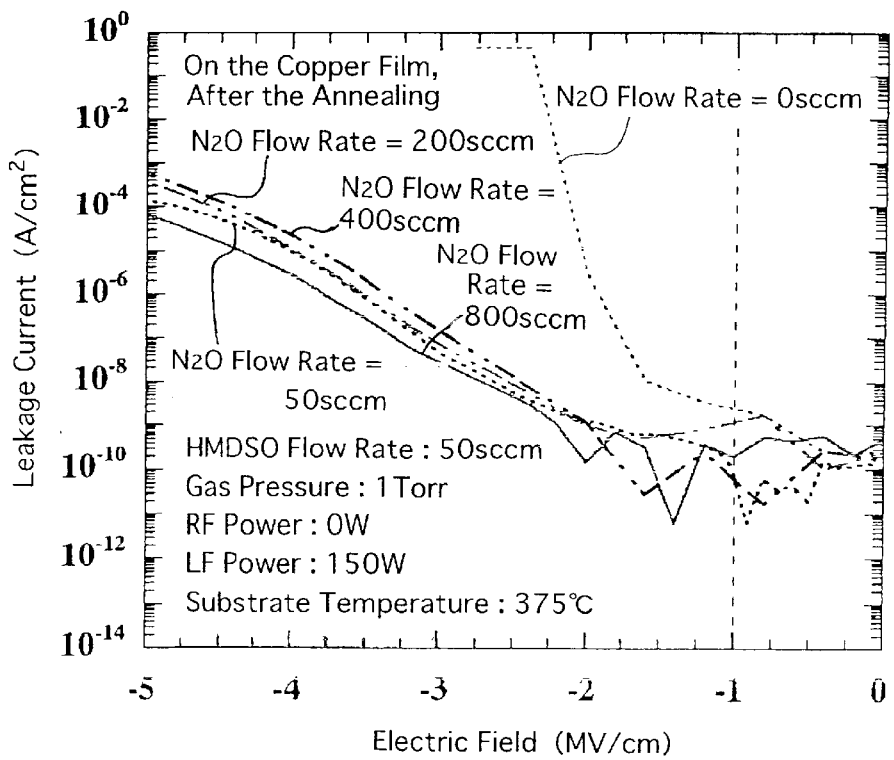
FIG. 12B is a graph showing characteristics of a leakage current of the low dielectric constant insulating film according to the fourth embodiment of the present invention after the annealing.

Also, FIG. 12A is a graph showing characteristics of the leakage current of the silicon-containing insulating film 36 formed in accordance with (Condition D), which was measured immediately after forming the film. On the other hand, FIG. 12B is a graph showing characteristics of the leakage current of the silicon-containing insulating film 36, which was formed in accordance with (Condition D) and was annealed in vacuum at 450° C. for 4 hours. In both investigation in FIGS. 12A and 12B, the $NH_3$ flow rate was variously changed. The method of measuring the leakage current and meanings of the ordinate and the abscissa of FIGS. 12A and 12B are similar to those explained in FIG. 9.

As is apparent by comparing FIGS. 12A and 12B, in the case where the $N_2O$ is added, the leakage current does not remarkably increase even after the annealing.

Figure 13:
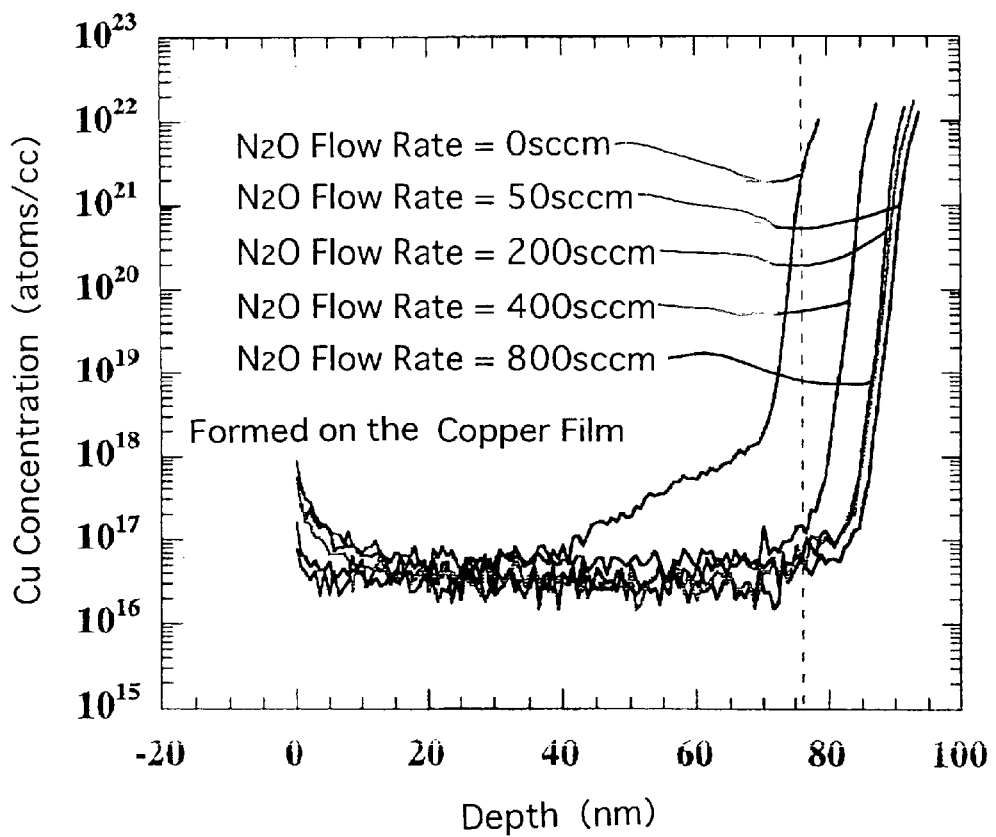
FIG. 13 is a graph showing investigation results of the copper diffusion in the low dielectric constant insulating film according to the fourth embodiment of the present invention.

FIG. 13 is a graph showing investigation results of the copper diffusion in the silicon-containing insulating film 36, which was formed in accordance with (Condition D) and was annealed in vacuum at 450° C. for 4 hours. In this investigation, the silicon-containing insulating film 36 was formed on the copper film (not shown). And various silicon-containing insulating films 36 were investigated at various level of the $N_2O$ flow rate within the (Condition D). The diffusion of the copper was examined by using SIMS.

As shown in FIG. 13, the copper is hardly diffused from the underlying copper film (not shown) into the silicon-containing insulating film 36. Though the copper concentration increases at the film depth of about 80 nm, this is because this depth is positioned very close to the underlying copper film (not shown), and thus there is no problem in practical use.

In (Condition D), the $N_2O$ flow rate is changed between 0 to 800 sccm. Another investigation was carried out where the $N_2O$ flow rate was changed between 1200 to 1600 sccm. In this case, the film forming conditions of the silicon-containing insulating film 36 is given by (Condition E) described in the following. In this (Condition E), the conditions other than the $N_2O$ flow rate are similar to those in (Condition D).

Condition E (i) Film forming gas conditions

HMDSO flow rate: 50 sccm $N_2O$ flow rate: 1200 to 1600 sccm gas pressure: 1 Torr substrate heating temperature: 375° C.

Figure 14:
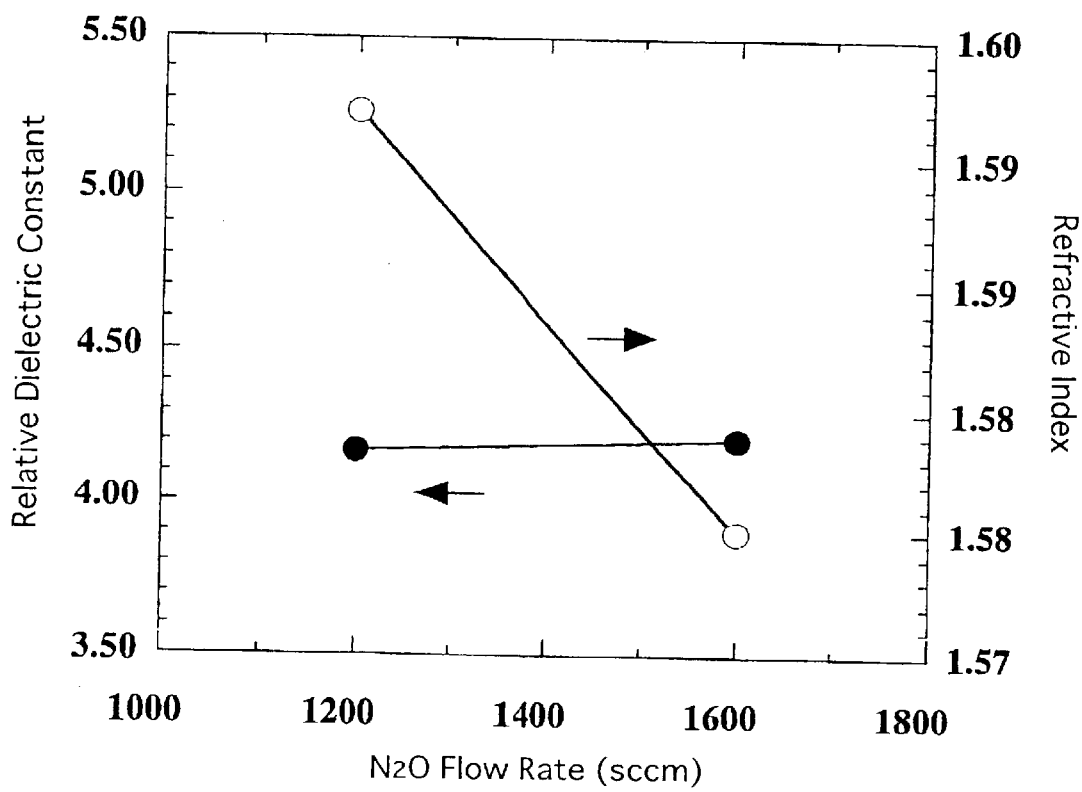
FIG. 14 is a graph showing characteristics of a relative dielectric constant and a refractive index of the low dielectric constant insulating film when an $N_2O$ flow rate is changed between 1200 to 1600 sccm in the fourth embodiment of the present invention.

(ii) Plasmanizing conditions high frequency power (13.56 MHz) $P_{RF}$: 0 W low frequency power (380 kHz) $P_{LF}$: 150 W distance between the upper electrode and the lower electrode: 12.5 mm FIG. 14 is a graph showing characteristics of the relative dielectric constant and the refractive index of the silicon-containing insulating film 36 formed in accordance with this (Condition E). The method of measuring the relative dielectric constant and the refractive index and meanings of the ordinate and the abscissa of FIG. 14 are similar to those explained in FIG. 6.

As shown in FIG. 14, the relative dielectric constant is about 4.2. This value is lower than the relative dielectric constant (about 7) of the silicon nitride film in the prior art.

Figure 15:
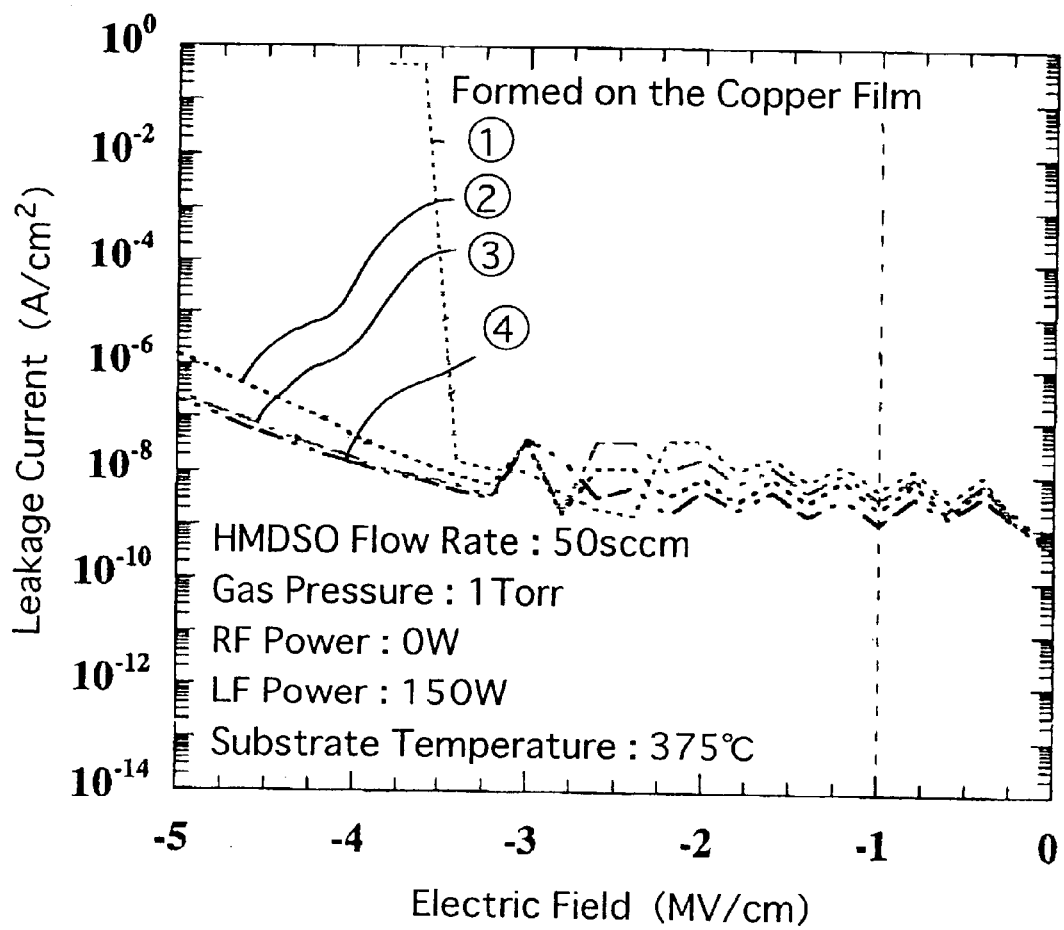
FIG. 15 is a graph showing a characteristic of leakage currents for those obtained immediately after the film formation and for those obtained after the annealing, when the $N_2O$ flow rate is changed between 1200 to 1600 sccm in the fourth embodiment of the present invention.

FIG. 15 is a graph showing characteristics of the leakage current of the various silicon-containing insulating films 36, which was measured either immediately after forming the film 36 or after annealing the film 36 in vacuum at 450° C. for 4 hours.

The method of measuring the leakage current and meanings of the ordinate and the abscissa of FIG. 15 are similar to those explained in FIG. 9.

As shown in FIG. 15, the leakage current does not remarkably increases even after the annealing.

In the above (Condition D) and (Condition E), the film forming gas is composed of HMDSO and $N_2O$. However, $NH_3$ may be added to this film forming gas. In this case, the film forming conditions of the silicon-containing insulating film 36 is given by (Condition F) described in the following.

Condition F (i) Film forming gas conditions

HMDSO flow rate: 50 sccm $N_2O$ flow rate: 200 sccm $NH_3$ flow rate: 0 to 800 sccm gas pressure: 1 Torr substrate heating temperature: 375° C.

Figure 16:
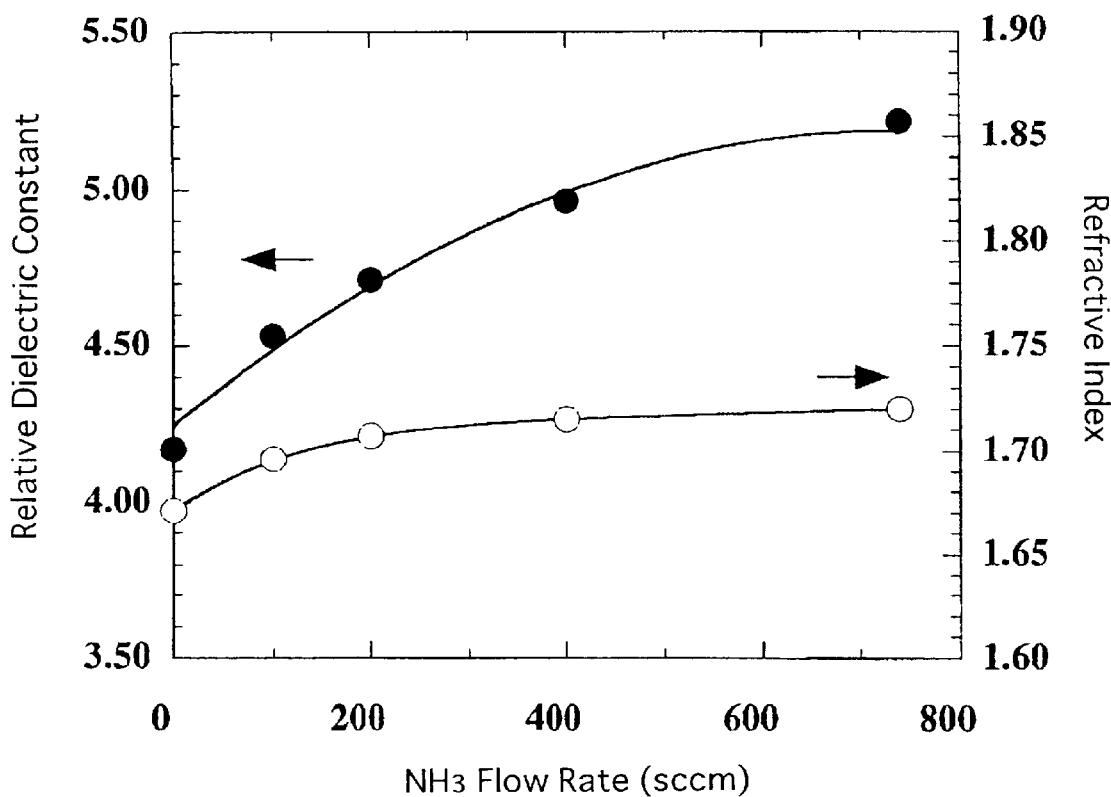
FIG. 16 is a graph showing the characteristics of the relative dielectric constant and the refractive index of the low dielectric constant insulating film when $NH_3$ is added to the film forming gas in the fourth embodiment of the present invention.

(ii) Plasmanizing conditions high frequency power (13.56 MHz) $P_{RF}$: 0 W low frequency power (380 kHz) $P_{LF}$: 150 W distance between the upper electrode and the lower electrode: 12.5 mm FIG. 16 is a graph showing characteristics of the relative dielectric constant and the refractive index of the silicon-containing insulating film 36 formed in accordance with this (Condition F). The method of measuring the relative dielectric constant and the refractive index and meanings of the ordinate and the abscissa of FIG. 16 are similar to those explained in FIG. 6.

As shown in FIG. 16, the relative dielectric constant is in the range of about 4.1 to 5.2. These values are lower than the relative dielectric constant (about 7) of the silicon nitride film in the prior art.

Figure 17:
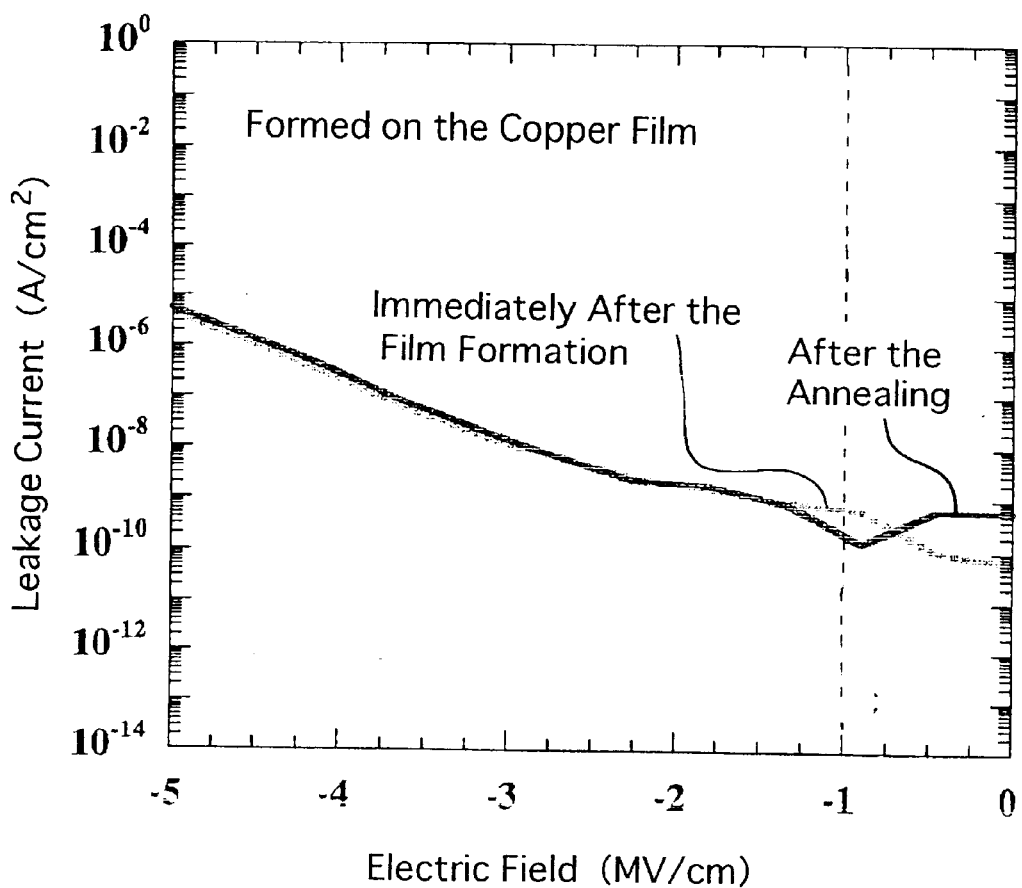
FIG. 17 is a graph showing the characteristics of the leakage current of the low dielectric constant insulating film when $NH_3$ is added to the film forming gas in the fourth embodiment of the present invention.

FIG. 17 is a graph showing characteristics of the leakage current of the silicon-containing insulating film 36 that was formed in accordance with this (Condition F) and was annealed in vacuum at 450° C. for 4 hours. For the sake of comparison, the leakage currents of the silicon-containing insulating film 36, which was measured immediately after the film formation, are also depicted in FIG. 17. The method of measuring the leakage current and meanings of the ordinate and the abscissa of FIG. 17 are similar to those in FIG. 9.

As shown in FIG. 17, the leakage current does not remarkably increases even after the annealing.

Figure 18:
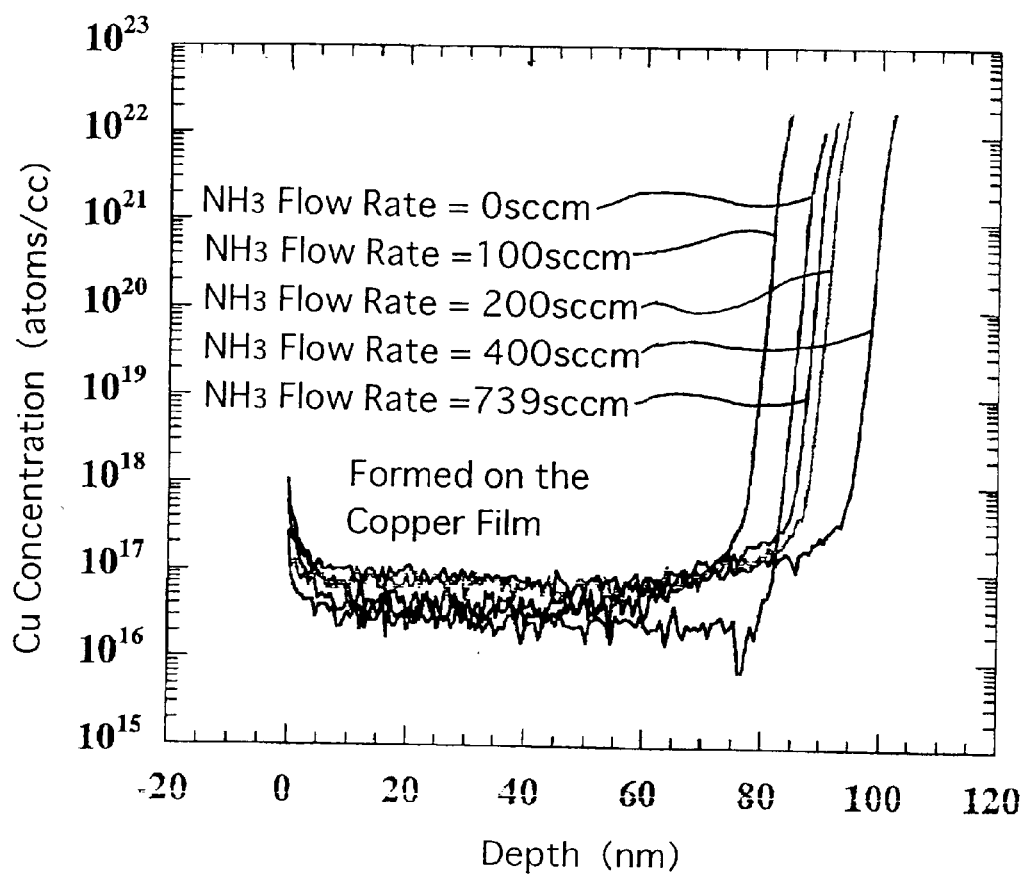
FIG. 18 is a graph showing investigation results of the copper diffusion in the low dielectric constant insulating film when $NH_3$ is added to the film forming gas in the fourth embodiment of the present invention.

FIG. 18 is a graph showing the copper diffusion in the silicon-containing insulating film 36 that was formed under this (Condition F) and was annealed in vacuum at 450° C. for 4 hours. In this investigation, the silicon-containing insulating film 36 was formed on the copper film (not shown). And various silicon-containing insulating films 36 were investigated at various level of the $NH_3$ flow rate within the (Condition F). The diffusion of the copper was examined by using SIMS. Meanings of the ordinate and the abscissa of FIG. 18 are similar to those explained in FIG. 10.

As shown in FIG. 18, the copper is seldom diffused from the underlying copper film (not shown) into the silicon-containing insulating film 36. Though the copper concentration increases at the film depth of about 80 nm, this is because this depth is positioned very close to the underlying copper film (not shown), and thus there is no problem in practical use.

Fifth Embodiment

Next, a semiconductor device and a method of manufacturing the same according to a fifth embodiment of the present invention will be explained with reference to FIG. 1, FIGS. 2A to 2D, FIGS. 3A and 3B, and FIGS. 20A to 20F hereunder.

FIGS. 20A to 20F are sectional views showing a semiconductor device and a method of manufacturing the same according to the fifth embodiment of the present invention.

In this embodiment, $HMDSO+CH_4+N_2$ is employed as film forming gas, and is introduced into the chamber 1 in accordance with the timing shown in FIG. 2B.

Figure 20A:
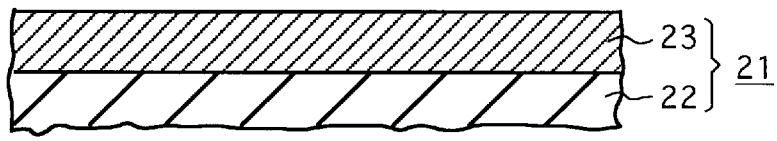
FIGS. 20A to 20F are sectional views showing a semiconductor device and a method of manufacturing the same according to a fifth embodiment of the present invention.

FIG. 20A is a sectional view showing the state after the copper wiring is formed. In FIG. 20A, a reference 22 denotes an underlying insulating film, and a reference 23 denotes a copper wiring (underlying wiring) formed by the plating. Although not shown, a TaN film, which serves as a barrier for the underlying insulating film 22 against the copper diffused from the copper wiring 23, and a Cu film formed by the sputter method are formed between the underlying insulating film 22 and the copper wiring (underlying wiring) 23. The underlying insulating film 22 and the copper wiring 23 constitute the substrate 21.

Figure 20B:
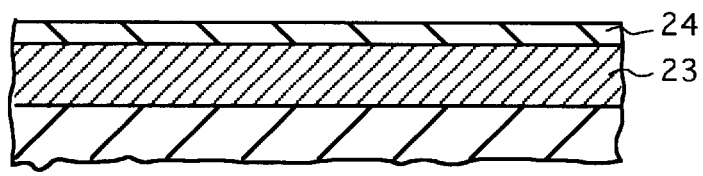

Under this condition, as shown in FIG. 20B, a barrier insulating film 24 is formed on the copper wiring 23 by the plasma CVD method. To form the barrier insulating film 24, the substrate 21 is put into the chamber 1 of the plasma film forming equipment 101 and loaded on the lower electrode 3. Then, the substrate 21 is heated up to 350° C., and this temperature is maintained.

Then, hexamethyldisiloxane (HMDSO), the $CH_4$ gas, and the $N_2$ gas are introduced into the chamber 1 of the plasma film forming equipment 101 shown in FIG. 1 at flow rates of 50 sccm, 50 sccm, and 50 sccm respectively, and the gas pressure in the chamber 1 is maintained at 1 Torr. Then, a power 100 W of the low frequency 380 kHz is applied to the lower electrode 3. No power is applied to the upper electrode 2.

Following these steps, hexamethyldisiloxane, $CH_4$, and $N_2$ are plasmanized. By maintaining this state for a predetermined time, the barrier insulating film 24 having a film thickness of 50 nm and containing Si, O, C, N, H is formed. According to the investigation, this insulating film containing Si, O, C, N, and H exhibited relative dielectric constant of the order of about 4.0 at the frequency of 1 MHz, and also exhibited a leakage current of $10^{-10}$ $A/cm^2$ when applied a electric field of 1 MV/cm.

Figure 20C:
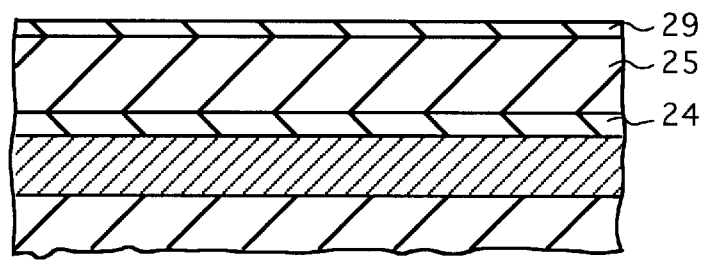

Then, as shown in FIG. 20C, a porous silicon-containing insulating film 25 having the low dielectric constant and a film thickness of about 500 nm is formed by the well-known plasma CVD method. As the method of forming the porous silicon-containing insulating film, for example, there are a method of forming a multi-layered insulating film by repeating the film formation by the low pressure thermal CVD method and the film formation by the plasma CVD method, and a method of laminating an organic film and an $SiO_2$ film alternatively and then removing the organic by the oxygen plasma ashing, etc.

Then, thin and high dense protection film 29 is formed. This protection film 29 serves to protect the porous insulating film 25 against ashing and etching. The examples of the protection film 29 are an NSG film (silicon oxide film not-containing the impurity) and an SiOC-containing insulating film. Unless the protection film 29 is provided, there is the possibility that, during the ashing of a photoresist film 26 or during the etching of the barrier insulating film 24 formed under the porous insulating film 25, the quality of the porous insulating film 25 is altered by the processing gas and hence its low dielectric constant characteristic is degraded. In some cases, however, the protection film 29 may be omitted.

Figure 20D:
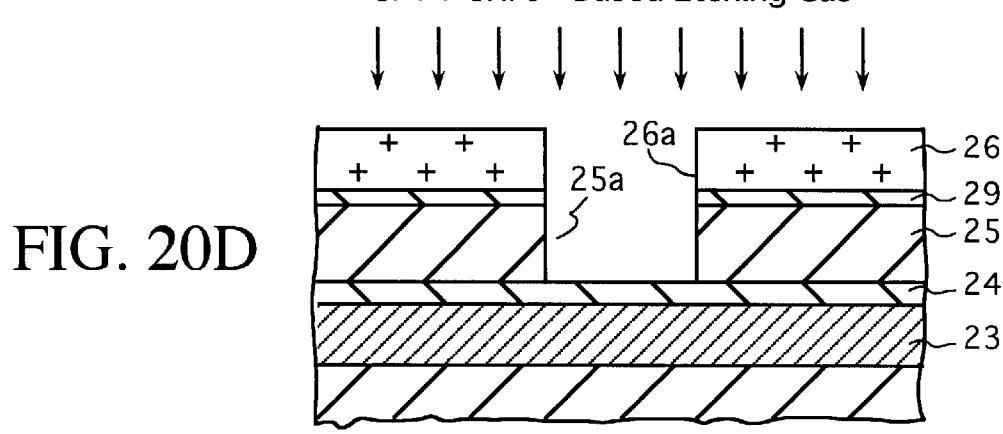

Then, as shown in FIG. 20D, the photoresist film 26 is formed and then an opening portion 26a is formed in a via-hole forming area of the photoresist film 26 by patterning the photoresist film 26. Then, the interlayer insulating film 25 is selectively etched and removed through the opening portion 26a in the photoresist film 26 by the reactive ion etching (RIE) using the plasmanized $CF_4+CHF_3$-based etching gas. Thus, an opening portion 25a is formed, and the barrier insulating film 24 exposes. Then, the ashing of the photoresist film 26 is performed. At this time, the barrier insulating film 24 has the etching resistance against the etching gas and the ashing gas for the interlayer insulating film 25. Therefore, the copper wiring 23 is not badly affected by the etching gas. The concentration of the $CF_4+CHF_3$-based etching gas may be adjusted by adding $Ar+O_2$, etc. to $CF_4+CHF_3$.

Figure 20E:
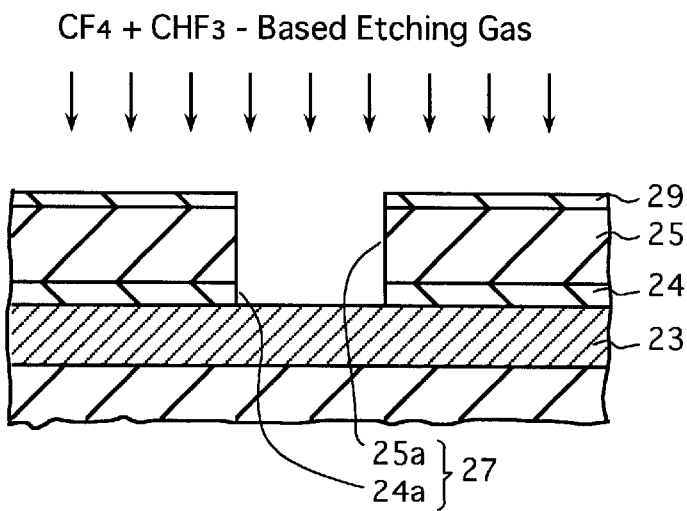

Then, as shown in FIG. 20E, the barrier insulating film 24 is selectively etched and removed via the opening portion in the protection film 29 and the opening portion 25a in the interlayer insulating film 25. This etching is performed by the reactive ion etching (RIE) using the plasmanized $CF_4+CHF_3$-based etching gas whose composition rate is changed from that used in etching the interlayer insulating film 25. By this step, a via-hole 27 is formed, and from the bottom thereof the copper wiring 23 exposes. At this time, the copper wiring 23 has the etching resistance against the etching gas of the barrier insulating film 24. Therefore, the copper wiring 23 is not badly affected by the etching gas. In this case, a surface of the copper wiring 23 is oxidized. The oxidized surface is, however, removed by exposing it to a reducing gas, e.g., plasma of $NH_3$, or hydrogen gas diluted by the inert gas such as argon, nitrogen, etc. after the etching step of the barrier insulating film 24.

Figure 20F:
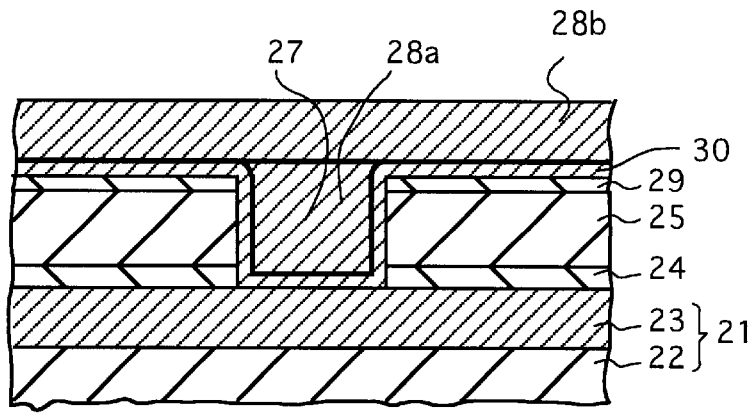

Then, as shown in FIG. 20F, a conductive film, e.g., an underlying conductive film 30 that consists of a barrier metal film such as tantalum nitride (TaN), etc. and a copper film formed by the sputter method is coated in the via hole 27. Then, a copper film 28a is filled on the underlying conductive film 30 in the via hole 27. Then, an upper wiring 28b made of copper or aluminum is formed so as to be connected to the lower wiring 23 via the copper film 28a.

Following these steps, the formation of the upper wiring 28b that is connected to the lower wiring 23 via the via hole 27, which is formed in the interlayer insulating film 25 and the barrier insulating film 24, is completed.

As described above, according to the fifth embodiment of the present invention, the barrier insulating film 24 containing Si, O, C, N, H is formed between the lower wiring 23 and the low dielectric constant insulating film 25 by plasmanizing and reacting the film forming gas that contains at least the nitrogen and the alkyl compound having the siloxane bonds.

By the way, the insulating film 25 having the low dielectric constant is usually porous, and thus the copper is ready to diffuse into such insulating film 25 from the outside. However, if the barrier insulating film 24 is formed between the lower wiring 23 and the porous insulating film 25, the barrier insulating film 24 can block the copper that would enter into the porous insulating film 25 from the copper wiring 23. Therefore, by interposing the barrier insulating film 24 between the wirings 23 and 28a, copper diffusion can be prevented and hence the leakage current flowing between the wirings 23 and 28a, which sandwich the porous insulating film 25, can be reduced, together with lowering the dielectric constant of the overall porous insulating film 25 including the barrier insulating film 24.

Furthermore, if the parallel-plate plasma film forming equipment is employed and the low frequency LF power supply 8 and the high frequency RF power supply 7 are connected to the lower electrode 3 and the upper electrode 2 respectively such that the low frequency power is set higher than the high frequency power, the barrier insulating film having the higher density can be formed.

Sixth Embodiment

Figure 21A:
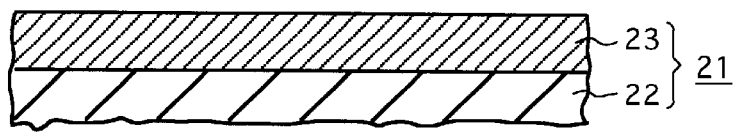
FIGS. 21A and 21B are sectional views showing a semiconductor device and a method of manufacturing the same according to a sixth embodiment of the present invention.
Figure 21B:
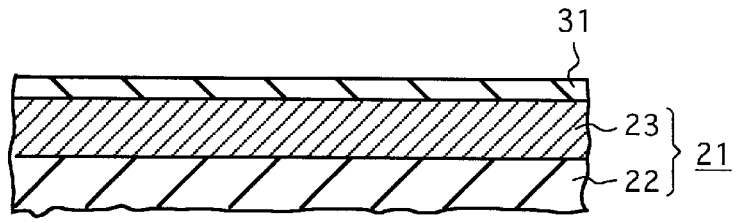

FIGS. 21A and 21B are sectional views showing a semiconductor device and a method of manufacturing the same according to a sixth embodiment of the present invention.

A difference from the fifth embodiment shown in FIG. 20 and FIG. 21 is that ammonia is employed instead of the nitrogen gas used in fifth embodiment.

In this embodiment, HMDSO+$CH_4$+$NH_3$ is employed as film forming gas, and is introduced into the chamber 1 in accordance with the timing shown in FIG. 2B.

First, as shown in FIG. 21A, the copper wiring 23 is formed on the underlying insulating film 22. Then, HMDSO, the $NH_3$ gas, and the $CH_4$ gas as the gas having the hydrocarbon are introduced into the chamber 1 of the plasma film forming equipment 101 shown in FIG. 1. Then, a barrier insulating film 31 is formed on the copper wiring 23 by the plasma CVD method. This state is shown in FIG. 21B.

More specifically, HMDSO, the $NH_3$ gas, and the $CH_4$ gas are introduced into the chamber 1 at flow rates of 50 sccm, 100 sccm, and 100 sccm respectively, and the gas pressure in the chamber 1 is maintained at 1 Torr. Then, a power 100 W of the low frequency 380 kHz is applied to the lower electrode 3 that holds the substrate, together with applying a 50 W of the high frequency 13.54 MHz to the upper electrode 2 that opposes to the lower electrode 3. According to this step, the film forming gas is plasmanized, and the barrier insulating film 31, which covers the copper wiring 23 and has a thickness of 50 nm, is formed by maintaining this state for 5 seconds.

Next, investigation results of the quality of the resultant barrier insulating film will be explained hereunder.

FIG. 19 is the sectional view showing the structure of the sample employed in the above investigation. The barrier insulating film 33 in the sample employed in this investigation was formed in the same way as the above barrier insulating film 31. In this investigation, the mercury probe 34 having the electrode area of 0.0230 cm was brought into contact with a surface of the barrier insulating film 33.

The measurement of the relative dielectric constant was conducted in the same manner as in the first embodiment.

The relative dielectric constant was in the order of 4.0. According to another investigation, the leakage current was in the order of $10^{-10}$ A/$cm^2$ when the electric field of 1 MV/cm is applied.

As described above, according to the sixth embodiment of the present invention, unlike the fifth embodiment, the film forming gas consisting of the alkyl compound having the siloxane bonds, the hydrocarbon ($CH_4$), and $NH_3$ is employed and, in addition to the lower frequency applied to the lower electrode 3, the high frequency power is also applied to the upper electrode 2 that opposes to the lower electrode 3 holding the substrate. As a result, since the dense insulating film having the low dielectric constant can be formed, not only the dielectric constant of the overall interlayer insulating film 25 including the barrier insulating film 31 can be reduced but also the leakage current can be reduced by preventing the diffusion of the copper more completely.

The present invention is explained in detail based on the embodiments as above. The scope of the present invention is not limited to the examples that are described particularly in the above embodiments, and modifications in the above embodiments obtained by not departing from the spirit of the invention should be contained in the scope of the present invention.

For example, in the first embodiment, hexamethyldisiloxane (HMDSO) is employed as the alkyl compound having the siloxane bonds. However, other silicon compound, e.g., octamethylcyclotetrasiloxane (OMCTS) or tetrametylcyclotetrasiloxane (TMCTS) may be employed in the alternative.

Also, in the first embodiment, the oxygen-containing gas is not employed. However, any one of nitrogen monoxide ($N_2O$), water ($H_2O$), or carbon dioxide ($CO_2$) may be employed. Since an amount of oxygen is small in such oxygen-containing gas, the oxidation of the lower wiring 23 can be suppressed when the barrier insulating film 24 is formed using these oxygen-containing gases.

In addition, though methane ($CH_4$) is employed as the gas having the hydrocarbon in the first and second embodiments, acetylene ($C_2H_2$), ethylene ($C_2H_4$), or ethane ($C_2H_6$) may be employed in the alternative.

Also, in the second embodiment, the film forming gas consisting of HMDSO+$CH_4$+$N_2$ is employed. However, the film forming gas consisting of the above gases except $CH_4$ may also be employed, or the oxygen-containing gas of any one of $N_2O$, $H_2O$, and $CO_2$ may be added to the above HMDSO+$CH_4$+$N_2$.

In addition, methylsilane may be employed instead of the alkyl compound having the siloxane bonds of the above embodiment. The combination of gases constituting the film forming gas is already shown in FIGS. 3A and 3B.

In this case, any one of monomethylsilane (SiH$_3$(CH$_3$)), dimethylsilane (SiH$_2$(CH$_3$)$_2$), trimethylsilane (SiH(CH$_3$)$_3$), and tetramethylsilane (Si(CH$_3$)$_4$) may be employed as methylsilane.

As described above, according to the present invention, the insulating film for covering the copper wiring is formed by plasmanizing and reacting the film forming gas containing at least the alkyl compound having siloxane bonds and at least any one of nitrogen (N$_2$) and ammonia (NH$_3$). Otherwise, such insulating film is formed by plasmanizing and reacting the film forming gas containing at least methylsilane, the oxygen-containing gas selected from any one of N$_2$O, H$_2$O, and CO$_2$, and any one of nitrogen (N$_2$) and ammonia (NH$_3$).

Since the film forming gas contains any one of nitrogen (N$_2$) and ammonia (NH$_3$) in any method, the formed film contains, in addition to mainly containing Si—C or CH$_3$, nitrogen.

Therefore, the insulating film that has the density close to the silicon nitride film and has the lower dielectric constant than the silicon nitride film can be formed.

Accordingly, if the interlayer insulating film has the multi-layered structure, and if the insulating film formed as above is applied to the barrier insulating film that constitutes one of the film of the multi-layered structure and is in contact with the copper wiring, copper diffusion from the copper wiring into the interlayer insulating film can be prevented and hence the leakage current flowing between the copper wiring that sandwiches the interlayer insulating film can be reduced. In addition, by employing the insulating film that has the lower dielectric constant than that of the above barrier insulating film as the other film that constitutes the interlayer insulating film, the dielectric constant of the overall interlayer insulating film can be lowered together with reducing the leakage current.

What is claimed is:

1. A semiconductor device manufacturing method for forming an insulating film over copper wiring exposed at a surface of a substrate, said method comprising:

placing the substrate on one of a pair of parallel-plate electrodes with the surface having the exposed copper wiring facing the other electrode;

converting a film-forming gas to a plasma by applying RF power to at least one of the electrodes, said film-forming gas containing (1) an alkyl compound having siloxane bonds and (2) nitrogen or ammonia; and contacting the plasma with the surface having the exposed copper wiring to form the insulating film thereon.

2. A semiconductor device manufacturing method according to claim 1, wherein the alkyl compound having the siloxane bonds is any one of hexamethyldisiloxane (HMDSO: (CH$_3$)$_3$Si—O—Si(CH$_3$)$_3$), octamethylcyclotetrasiloxane (OMCTS:

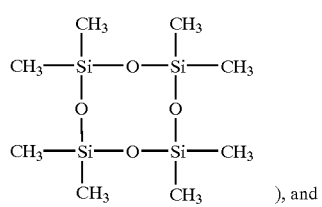

), and tetramethylcyclotetrasiloxane (TMCTS:

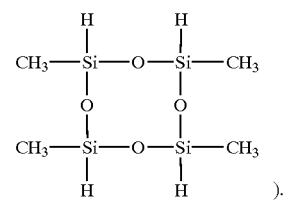

).

3. A semiconductor device manufacturing method according to claim 1, wherein the film-forming gas further contains hydrocarbon.

4. A semiconductor device manufacturing method according to claim 3, wherein the hydrocarbon is any one selected from the group consisting of methane (CH$_4$), acetylene (C$_2$H$_2$), ethylene (C$_2$H$_4$), and ethane (C$_2$H$_6$).

5. A semiconductor device manufacturing method according to claim 3, wherein the film-forming gas further contains an oxygen-containing gas, wherein the oxygen-containing gas is any one selected from the group consisting of N$_2$O, H$_2$O, and CO$_2$.

6. A semiconductor device manufacturing method according to claim 1, wherein the insulating film is a barrier insulating film that is one of plural films constituting an interlayer insulating film which has a multi-layered structure and which is formed on and in contact with the copper wiring.

7. A semiconductor device manufacturing method according to claim 1, wherein said RF power is AC power having a frequency of 100 kHz to 1 MHz and is applied to one of the electrodes, the one electrode holding the substrate, in forming the film.

8. A semiconductor device manufacturing method according to claim 1, wherein said RF power is AC power having a frequency of more than 1 MHz and is applied to one of the opposing electrodes, the other of the opposing electrodes holding the substrate, in forming the film.

9. A semiconductor device having a copper wiring and an insulating film covering the copper wiring, wherein the insulating film is formed by a semiconductor device manufacturing method set forth in claim 1.

10. A semiconductor device according to claim 9, wherein the insulating film is a barrier insulating film that is one of plural films constituting an interlayer insulating film, which has a multi-layered structure and is formed on and in contact with the copper wring.

11. A semiconductor device manufacturing method according to claim 1 wherein said film-forming gas consists essentially of the alkyl compound and any one of nitrogen and ammonia.

12. A semiconductor device manufacturing method according to claim 1 wherein the formed insulating film has a dielectric constant within the range of 3.9–5.5.

13. A semiconductor device manufacturing method for forming an insulating film over copper wiring exposed at a surface of a substrate, wherein the insulating film is formed by plasmanizing and reacting a film-forming gas containing (1) methylsilane, (2) an oxygen-containing gas, and (3) nitrogen or ammonia, where the methylsilane is any one selected from the group consisting of monomethylsilane (SiH$_3$(CH$_3$)), dimethylsilane (SiH$_2$(CH$_3$)$_2$), trimethylsilane (SiH(CH$_3$)$_3$), and tetramethylsilane (Si(CH$_3$)$_4$), and the oxygen-containing gas is any one selected from the group consisting of N$_2$O, H$_2$O and CO$_2$.

14. A semiconductor device manufacturing method according to claim 13, wherein the film-forming gas further contains a hydrocarbon.

15. A semiconductor device manufacturing method according to claim 14, wherein the hydrocarbon is any one of methane ($CH_4$), acetylene ($C_2H_2$), ethylene ($C_2H_4$), and ethane ($C_2H_6$).

16. A semiconductor device manufacturing method according to claim 11 wherein the formed insulating film has a dielectric constant within the range of 3.9–5.5.

17. A semiconductor device manufacturing method according to claim 13, wherein parallel-plate electrodes are employed for said plasmanizing, and an AC power having a frequency of 100 kHz to 1 MHz is applied to one of the electrodes, the one electrode holding the substrate, in forming the film.

18. A semiconductor device manufacturing method according to claim 13, wherein parallel-plate opposing electrodes are employed for said plasmanizing, and an AC power having a frequency of more than 1 MHz is applied to one of the opposing electrodes, the other of the opposing electrodes holding the substrate, in forming the film.

* * * * *